(12) United States Patent
Gutt et al.

(10) Patent No.: US 7,842,590 B2
(45) Date of Patent: Nov. 30, 2010

(54) METHOD FOR MANUFACTURING A SEMICONDUCTOR SUBSTRATE INCLUDING LASER ANNEALING

(75) Inventors: Thomas Gutt, Taufkirchen (DE); Frank Umbach, Munich (DE); Hans Peter Felsl, Munich (DE); Manfred Pfaffenlehner, Munich (DE); Franz-Josef Niedernostheide, Muenster (DE); Holger Schulze, Villach (AT)

(73) Assignee: Infineon Technologies Austria AG, Villach (AT)

( * ) Notice: Subject to any disclaimer, the term of this patent is extended or adjusted under 35 U.S.C. 154(b) by 141 days.

(21) Appl. No.: 12/110,740

(22) Filed: Apr. 28, 2008

(65) Prior Publication Data

US 2009/0267200 A1    Oct. 29, 2009

(51) Int. Cl.
   *H01L 21/425* (2006.01)
(52) U.S. Cl. ................ 438/530; 257/E21.347
(58) Field of Classification Search ................ 438/134, 438/378, 530; 257/E21.347
   See application file for complete search history.

(56) References Cited

U.S. PATENT DOCUMENTS

| 4,151,008 | A | 4/1979 | Kirkpatrick |
| 6,274,892 | B1 | 8/2001 | Kub et al. |
| 6,559,023 | B2 * | 5/2003 | Otsuki et al. ................ 438/342 |
| 6,610,572 | B1 | 8/2003 | Takei et al. |
| 2005/0161746 | A1 * | 7/2005 | Mauder et al. ............... 257/370 |

FOREIGN PATENT DOCUMENTS

| DE | 10330571 A1 | 2/2005 |
| DE | 10361136 A1 | 7/2005 |
| DE | 102004013931 A1 | 10/2005 |

OTHER PUBLICATIONS

"Laser Thermal Annealing for Power Field Effect Transistor by using Deep Melt Activation", Thomas Gutt, et al., 14th IEEE International Conference on Advanced Thermal Processing of Semiconductors, Oct. 10-13, 2006.

* cited by examiner

*Primary Examiner*—Chandra Chaudhari
(74) *Attorney, Agent, or Firm*—Dicke, Billig & Czaja, PLLC

(57) ABSTRACT

A method for manufacturing a semiconductor device by laser annealing. One embodiment provides a semiconductor substrate having a first surface and a second surface. The second surface is arranged opposite to the first surface. A first dopant is introduced into the semiconductor substrate at the second surface such that its peak doping concentration in the semiconductor substrate is located at a first depth with respect to the second surface. A second dopant is introduced into the semiconductor surface at the second surface such that its peak doping concentration in the semiconductor substrate is located at a second depth with respect to the second surface, wherein the first depth is larger than the second depth. At least a first laser anneal is performed by directing at least one laser beam pulse onto the second surface to melt the semiconductor substrate, at least in sections, at the second surface.

21 Claims, 19 Drawing Sheets

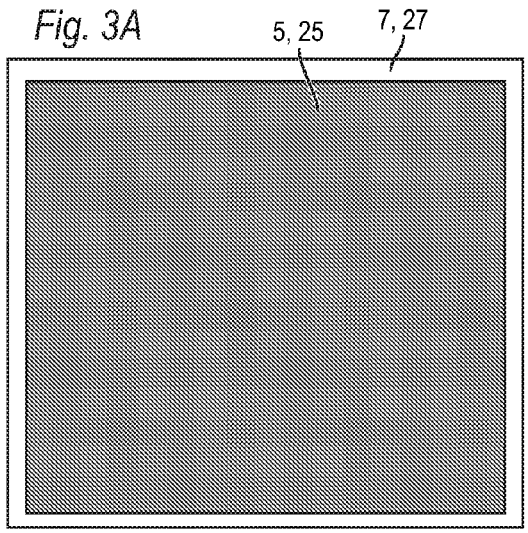
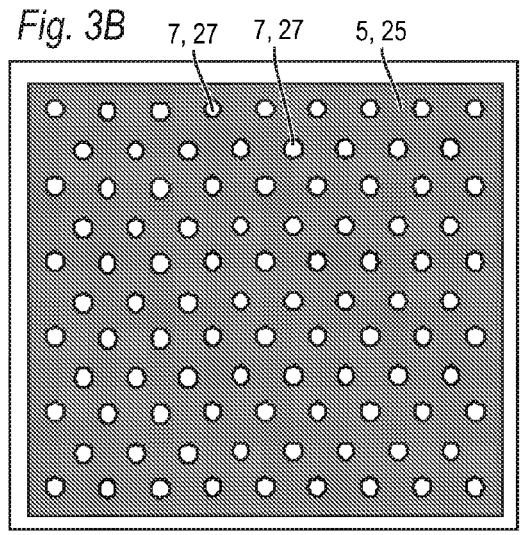
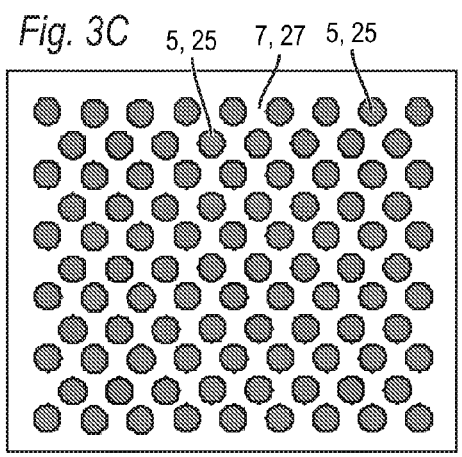
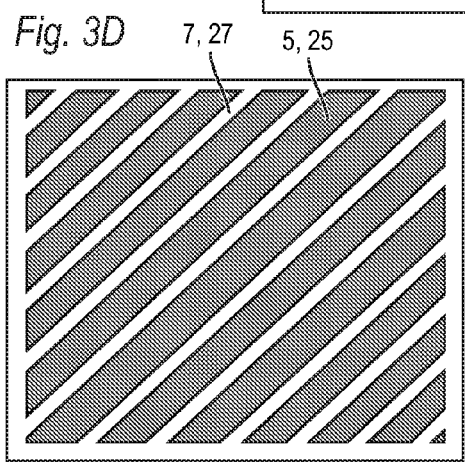
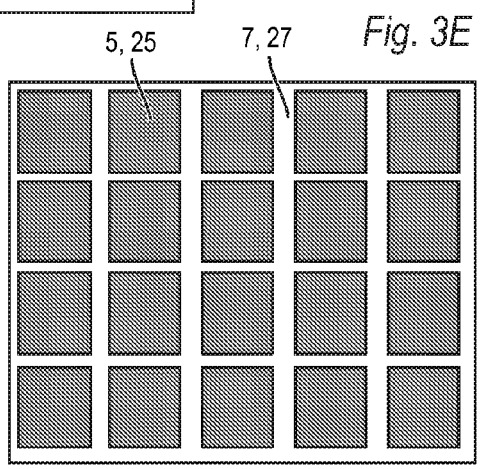

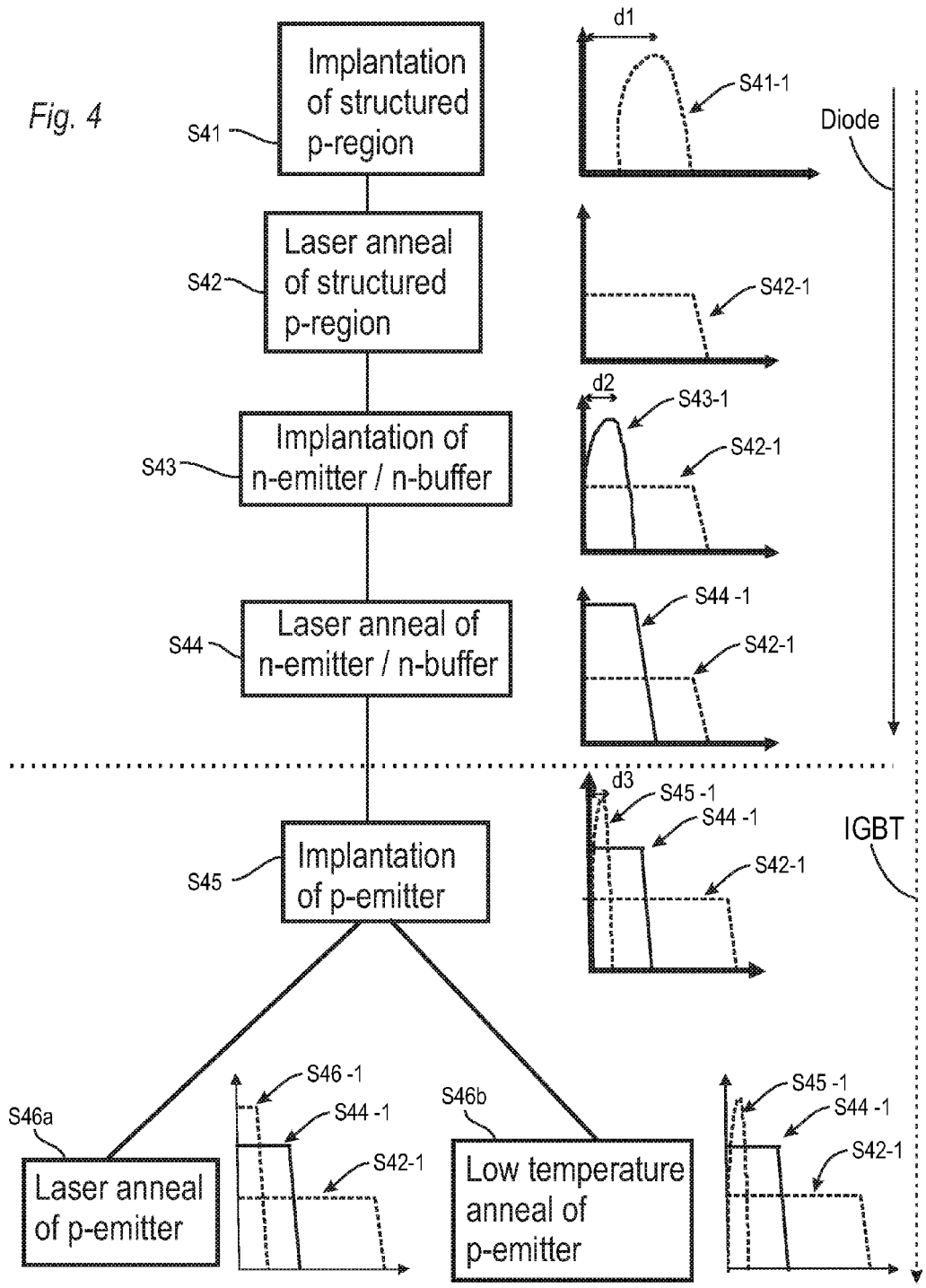

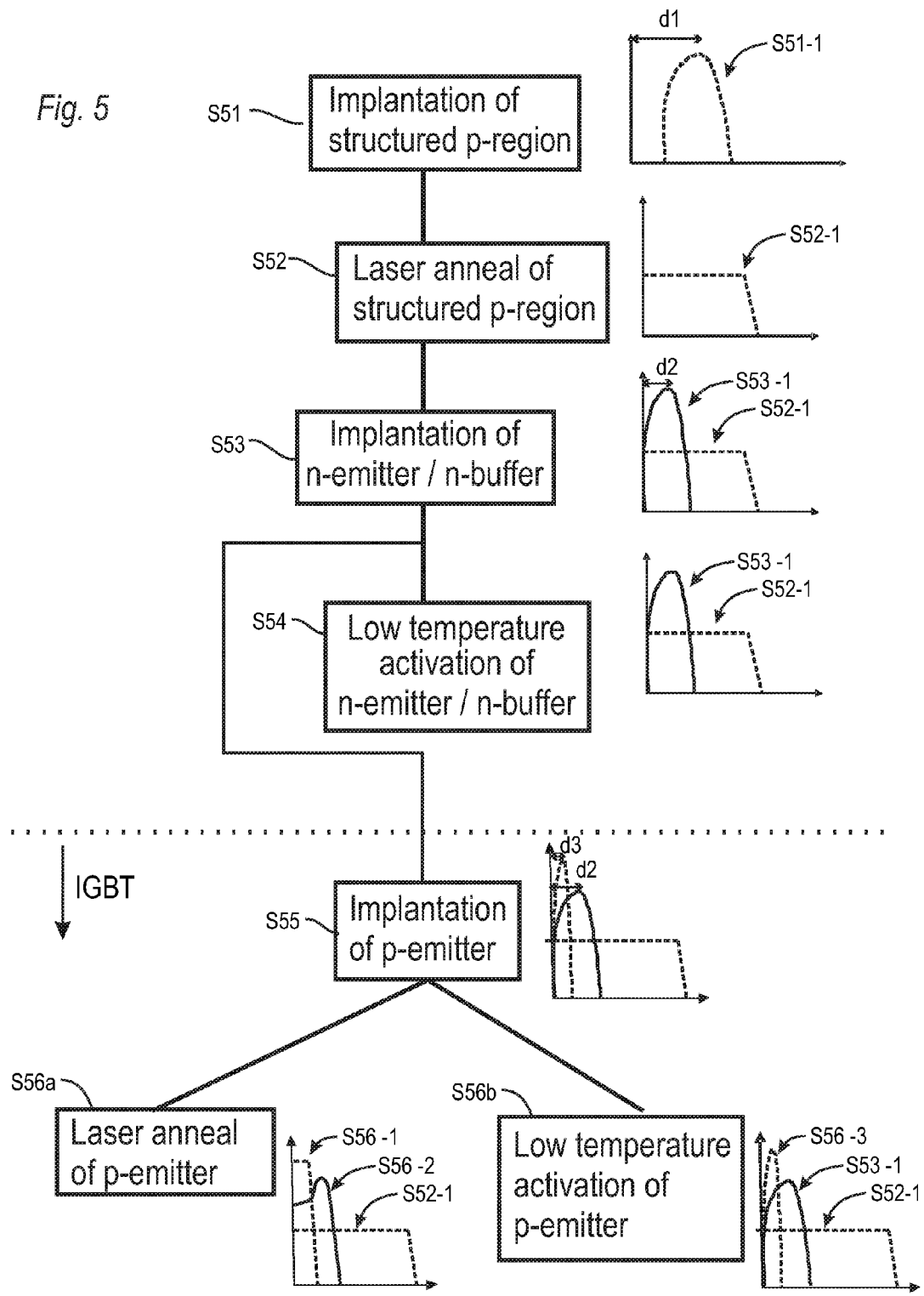

Fig. 11
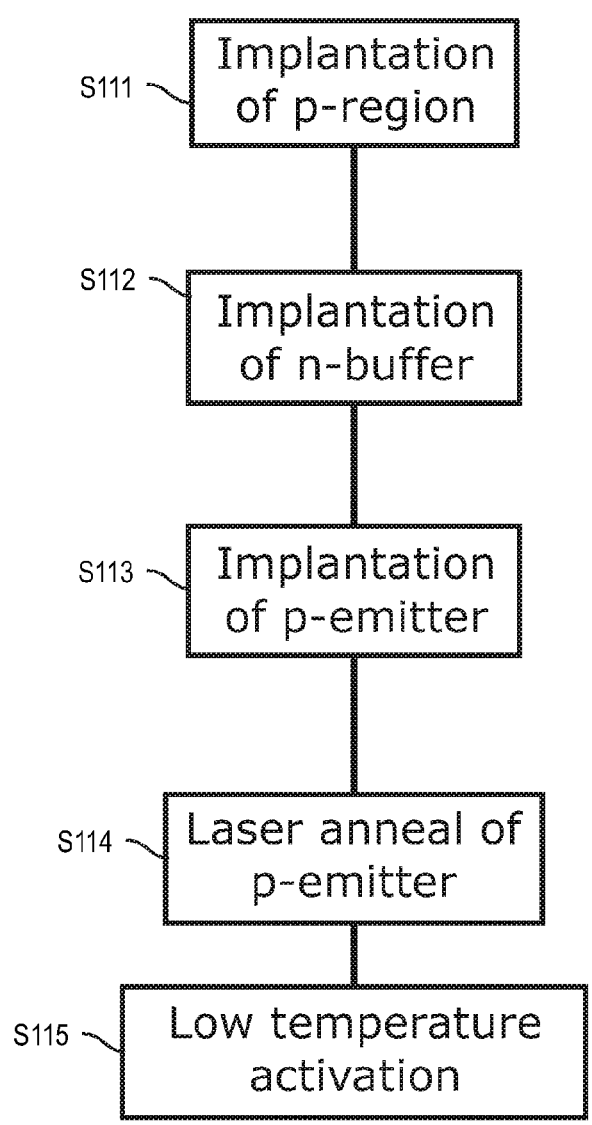
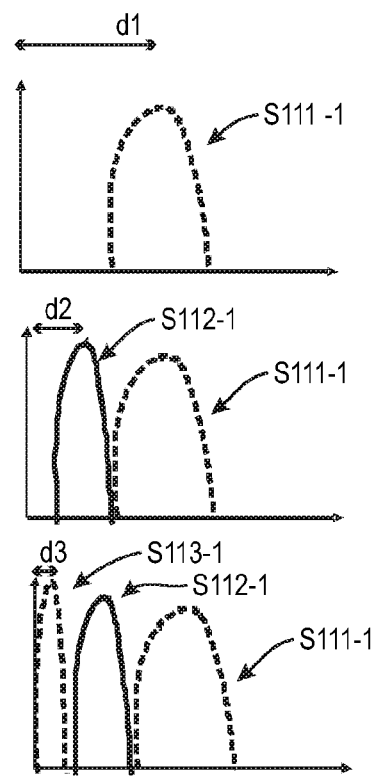
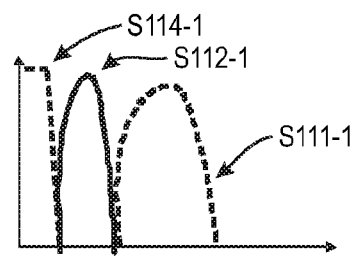

METHOD FOR MANUFACTURING A SEMICONDUCTOR SUBSTRATE INCLUDING LASER ANNEALING

BACKGROUND

This description refers to one or more embodiments of a method for manufacturing semiconductor devices and to a method for manufacturing a semiconductor device by using laser annealing.

Power semiconductor devices are tailored devices with optimised characteristics for specific purposes. For example, for improving the on-state characteristics of high voltage diodes and IGBTs (Insulated Gate Bipolar Transistor) it is desired to reduce the width or length of the drift region while maintaining the maximum reverse voltage. Therefore, a compromise between blocking capability, on-state losses, robustness and softness is desired. It is therefore an ongoing aim to tailor the doping profiles of the respective doping regions to meet the challenging demands, and suitable manufacturing processes needs to be developed therefor.

Attempts to reduce the width of the drift region while maintaining high reverse blocking voltage include the integration of a structured p-doped region in proximity to the backside of the device's substrate close to the n-emitter in case of a diode or close to the n-buffer in case of an IGBT. The integrated p-region generates a hole current when the electric field build up in reverse state reaches the backside of the device's substrate. The generation of the hole current can be caused by avalanche and provides additional charge carrier to prevent that the load current undergoes chopping during commutation of the device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A to 3E illustrate different embodiments of a structured doping region.

FIG. 4 illustrates processes of a method for manufacturing a diode and an IGBT according to one embodiment.

FIG. 5 illustrates processes of a method for manufacturing a diode and an IGBT according to one embodiment.

FIG. 11 illustrates processes of a method for manufacturing an IGBT according to one embodiment.

DETAILED DESCRIPTION

Figure 1A:
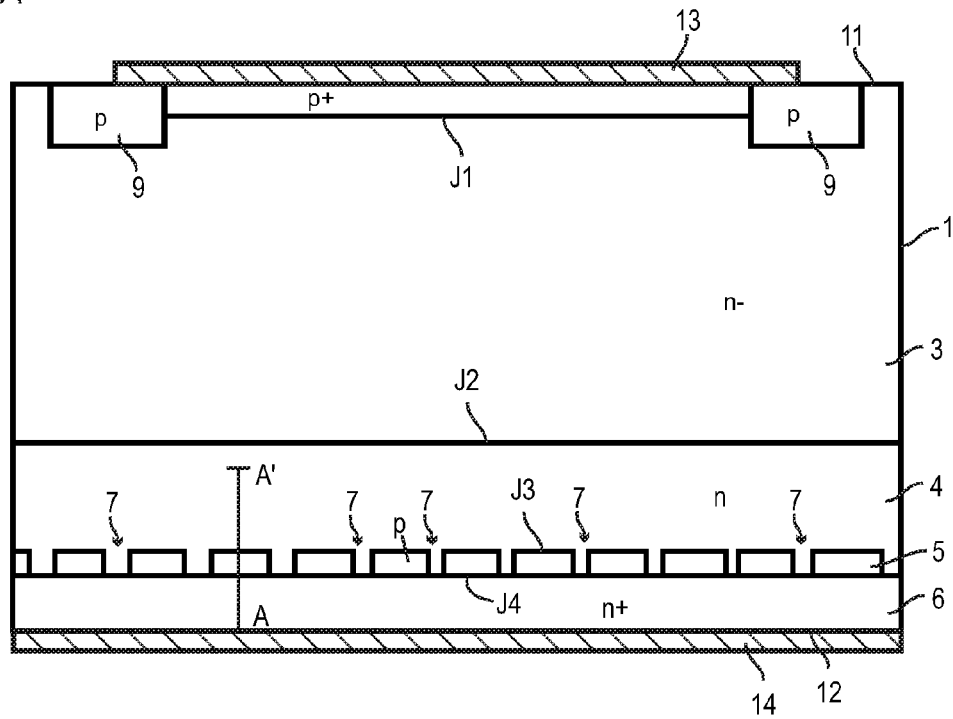
FIG. 1A illustrates a cross-sectional view of a vertical diode according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only.

The term "lateral" as used in this specification intends to describe an orientation parallel to the main surface of a semiconductor substrate.

The term "vertical" as used in this specification intends to describe an orientation which is arranged perpendicular to the main surface of the semiconductor substrate.

In this specification, a second surface of a semiconductor substrate is considered to be formed by the lower or backside surface while a first surface is considered to be formed by the upper or front surface of the semiconductor substrate. The terms "above" and "below" as used in this specification therefore describe a relative location of a structural feature to another structural feature with consideration of this orientation.

In the context of this specification, the term "impurity concentration" or "impurity profile" describes the chemical concentration of a dopant before an anneal. The distribution of the dopant after an anneal, i.e. the chemical concentration of the dopant, after an anneal is referred to as "concentration profile". Different thereto, "doping concentration" or "doping profile" refers to the distribution of the activated dopant or impurities after a thermal anneal. The impurity and the concentration profile can be determined, for example, by SIMS measurements whereas the doping profile can be determined, for example, by SRP measurements.

Specific embodiments described in this specification pertain to, without being limited thereto, power semiconductor devices and particularly to devices which are controlled by field-effect such as power field-effect transistors (FETs) and insulated gate bipolar transistors (IGBTs). Other embodiments refer to power rectifiers such as high-voltage diodes, thyristors, or semiconductor devices having a FET-structure.

In this description, p-doped is referred to as first conductivity type while n-doped is referred to as second conductivity type. It goes without saying that the devices can be formed with opposite doping relations so that the first conductivity type is n-doped and the second conductivity type is p-doped. Furthermore, the Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration has the same absolute doping concentration unless otherwise stated. For example, two different n+ regions can have different absolute doping concentrations. The same applies, for example, to an n+ and a p+-doping region.

According to one embodiment, a method for manufacturing a semiconductor device is provided. The method includes providing a semiconductor substrate having a first surface and a second surface, the second surface being arranged opposite to the first surface. A first dopant is introduced into the semiconductor substrate at the second surface such that its peak doping concentration in the semiconductor substrate is located at a first depth with respect to the second surface. A second dopant is introduced into the semiconductor surface at the second surface such that its peak doping concentration in the semiconductor substrate is located at a second depth with respect to the second surface, wherein the first depth is larger than the second depth. At least a first laser anneal is performed by directing at least one laser beam pulse onto the second surface to melt the semiconductor substrate, at least in sections, at the second surface.

According to another embodiment, a method for manufacturing a semiconductor device is provided. The method includes providing a semiconductor substrate having a first surface and a second surface, wherein the second surface is arranged opposite to the first surface. A first doping region is formed by introducing a first dopant into the semiconductor substrate at the second surface such that its peak doping concentration in the semiconductor substrate is located at a first depth with respect to the second surface, and by performing at least a first laser anneal by directing at least one laser beam pulse onto the second surface to melt the semiconductor substrate, at least in sections, at the second surface to activate the first dopant. After forming the first doping region, a second doping region is formed by introducing a second dopant into the semiconductor surface at the second surface such that its peak doping concentration in the semiconductor substrate is located at a second depth with respect to the second surface, wherein the first depth is larger than the second depth, and by performing at least a second laser anneal by directing at least a further laser beam pulse onto the second surface to melt the semiconductor substrate, at least in sections, at the second surface to activate the second dopant, wherein the second laser anneal is performed after introducing the second dopant.

Using a laser anneal, which at least partially melts the second surface of the semiconductor substrate, allows to control and increase the amount of activated dopant. Such an at least partially melting laser anneal may result in doping profiles having a plateau-like shape and steep sidewall slopes. This provides for the formation of more abrupt pn-junctions which helps to improve the device characteristics.

According to another embodiment, a semiconductor device is provided. The semiconductor substrate includes a first surface and a second surface, the second surface being arranged opposite to the first surface. At least a metallization layer is arranged on the first surface. At least a first doping region of a first conductivity type is arranged in proximity to the second surface. At least a second doping region of a second conductivity type opposite to the first conductivity type is arranged in proximity to the second surface, wherein the first and second doping regions have respective peak doping concentrations which are located at different depths with respect to the second surface. A pn-junction is formed by the first and second doping region, wherein one of the first doping region, the second doping region, or both doping regions has a plateau-shaped doping profile running in a direction perpendicular to the second surface.

With reference to FIG. 1, a first embodiment of a semiconductor device is described.

FIG. 1A illustrates a cross-sectional view of a high-voltage diode. The diode includes a semiconductor substrate 1 having a first surface 11 and a second surface 12 arranged opposite to the first surface 11. The semiconductor substrate 1 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining to different semiconductor materials a heterojunction semiconductor material is formed. Examples of heterojunction semiconductor materials include, without being limited thereto, silicon-silicon carbide (Si—SiC) and SiGe graded heterojunction semiconductor material. For power semiconductor applications currently mainly Si, SiC and Si—SiC material are used.

The semiconductor material 1 can be a single bulk mono-crystalline material. It is also possible, that the semiconductor material 1 includes a bulk mono-crystalline material and at least one epitaxial layer formed thereon. Using epitaxial layers provides more freedom in tailoring the background doping of the material since the doping concentration can be adjusted during deposition of the epitaxial layer or layers.

As illustrated in FIG. 1A, the diode includes a highly p-doped region 2 arranged in the semiconductor substrate 1 at the first surface 11 and a highly n-doped emitter region 6 at the second surface 12. Between p-doped region 2 and emitter region 6 an n-doped drift region 3, an n-doped field stop region 4 and a structured p-doped region 5 are arranged in this order from the p-doped region 2 to the emitter region 6. The p-doped region 2 is contacted by a first metallization layer 13 arranged on the first surface 11 while emitter region 6 is contacted by a second metallization layer 14 formed on the second surface 12 of semiconductor substrate 1. The first metallization 13 functions in this embodiment as anode while the second metallization layer 14 functions as cathode. The diode may further include lateral termination regions 9 arranged at the first surface 11 for terminating p-doped region 2.

Highly p-doped region 2 forms a pn-junction J1 with n-doped drift region 3 of the diode. At a side opposite to the anode 2, drift region 3 is in contact with the n-doped field stop region 4 and forms there an nn$^-$-junction J2 with field stop region 4. The field stop region 4 is arranged between drift region 3 and emitter region 6 and has a higher doping concentration than drift region 3 to prevent the electric field from reaching emitter region 6 under static blocking condition. Between the emitter region 6 and the field stop region 4 the structured p-doped region 5 is arranged which forms a pn-junction J3 with field stop region 4 and a pn-junction J4 with n-emitter region 6. Structured p-doped region 5 includes, when viewing in the cross-sectional view perpendicular to the first and second surfaces 11 and 12, lateral spaces or portions 7 which are of opposite conductivity to the structured p-doped region 5 so that the current can flow from cathode 14 to anode 13 in the on-state of the diode without being blocked by the structured p-doped region 5. Hence, a high-conductive electrical path in the forward diode operation mode is provided in FIG. 1A by the lateral spaces 7 arranged between portions of the structured p-doped region 5.

The structure of the diode in proximity to the second surface, i.e. the arrangement of the field stop region 4, structured p-doped region 5 and n-emitter 6, as illustrated in FIG. 1A can also be used for a power MOSFET having a vertical structure. For sake of simplicity, reference is only made to a diode.

Figure 1B:
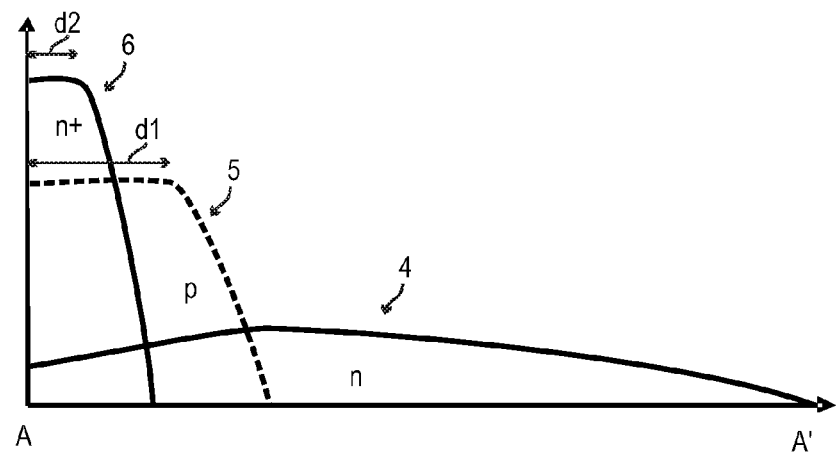
FIG. 1B illustrates a doping profile along line AA' in FIG. 1A.

FIG. 1B schematically represents the doping profile of the field stop region 4, structured p-doped region 5 and n-emitter region 6 along line AA' in FIG. 1A. As it becomes apparent from FIG. 1B the peak doping concentration of the respective doping regions are arranged at different depths with respect to the second surface 12. As it becomes more apparent below, structured p-doped region 5 can also be referred to as first doping region while n-emitter region 6 can also be referred to as second doping region in certain embodiments. First doping region 5 has a peak doping concentration located at a first depth d1 with respect to the second surface 12 while second doping region 6 has a peak doping concentration located at a second depth d2 with respect to the second surface 12, wherein the first depth d1 is larger than the second depth d2.

In this specification, the depth of a doping region is considered to be the location of its maximum with reference to the second surface 12 or the location of the onset of a steep drop towards greater depth. As it becomes more apparent from the description below, a melting laser anneal can significantly affect and change the impurity distribution of a dopant which may result in a transition of a typically peak-shaped impurity profile after implantation into a plateau-like chemical or doping profile having a steep drop towards greater depth after the laser anneal. The onset of the steep drop is typically influenced by the melting depth of the laser anneal.

Figure 2A:
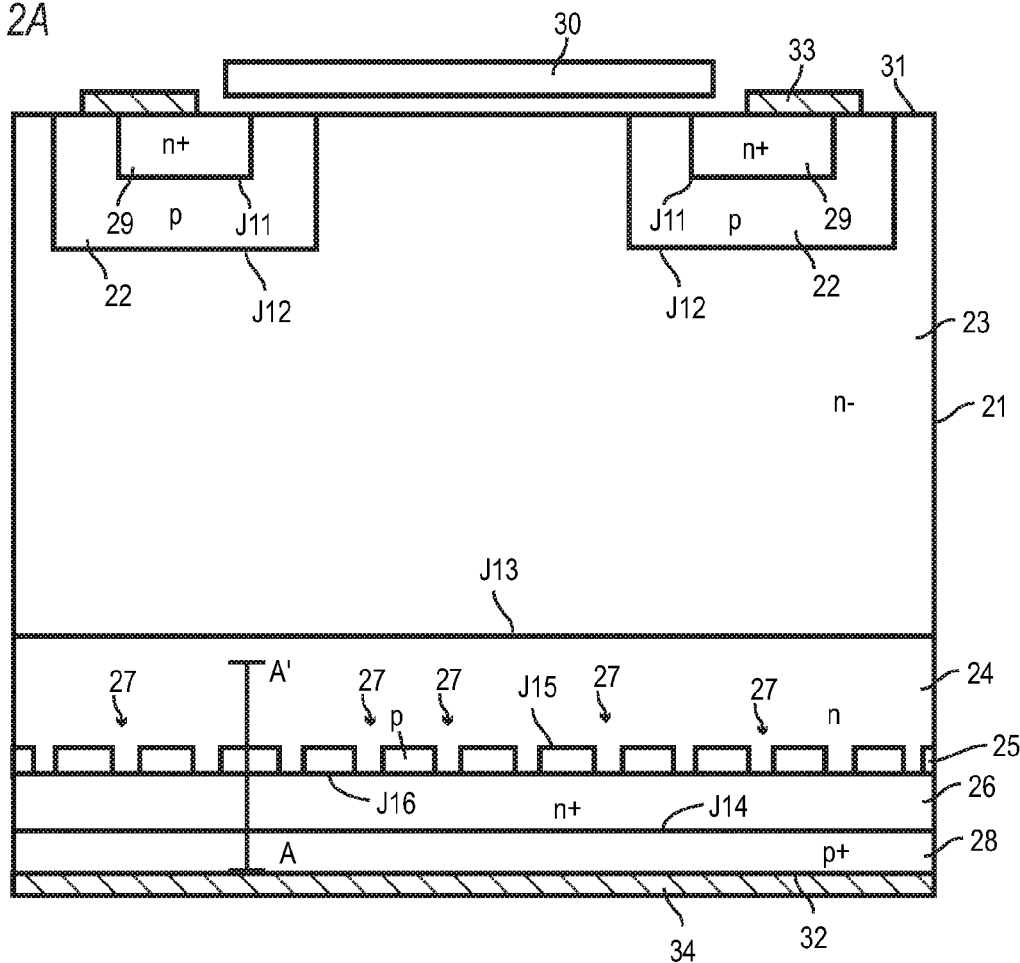
FIG. 2A illustrates a cross-sectional view of an IGBT according to one embodiment.

With respect to FIG. 2A a further embodiment is described which pertains to an IGBT. The IGBT includes a semiconductor substrate 21 which can be made of any suitable semiconductor materials. Specific materials are mentioned in connection with the embodiment of FIG. 1A and are not repeated here. Typically, Si, SiC and Si—SiC are mainly used for IGBTs and particularly high voltage power IGBTs. The semiconductor material 21 has a first surface 31 and a second surface 32 arranged opposite to the first surface 31. A first metallisation layer 33 is arranged on the first surface 31 while a second metallisation layer 34 is arranged on the second semiconductor surface 32.

The semiconductor substrate 21 includes, from the second surface 32 to the first surface 31 in this order, a highly p-doped emitter region 28, a highly n-doped buffer region 26, a structured p-doped region 25, an n-doped field stop region 24, an n-doped drift region 23, a p-doped base region 22 and a highly n-doped source region 29. A gate electrode 30 is arranged on the first surface 31 and insulated therefrom by a not-illustrated insulation layer. Base region 22 and source region 29 are formed in this embodiment as diffused regions so that the IGBT can also be referred to as double diffused IGBT. A skilled person will appreciate that an IGBT can also have trench structures which accommodate the gate electrode and an optional field electrode.

A first pn-junction J11 is formed between source region 29 and body region 22, a second pn-junction J12 is formed between body region 22 and drift region 23. Second pn-junction J12 is operated usually in reverse mode and controlled by gate electrode 30. An nn$^-$-junction J13 is formed between weakly doped drift region 23 and field stop region 24 which is higher doped than drift region 23. A third pn-junction J14 is formed between n-buffer region 26 and emitter region 28. Further pn-junctions are formed by the structured p-doped region 25; pn-junction J15 with field stop region 24 and pn-junction 16 with n-buffer region 26. In case of a power FET, no p-emitter 28 is provided.

Similar to the embodiment of FIG. 1A, structured p-doped region 25 has lateral spaces 27 to provide an electrical path between buffer region 26 and field stop region 24.

When comparing the structure illustrated in FIG. 2A with the structure illustrated in 1A both structures include a weakly n-doped drift region 3, 23, an n-doped field stop region 4, 24, and a structured p-doped region 5, 25, respectively. N-doped emitter 6 of the diode illustrated in FIG. 1A corresponds to n-buffer region 26 of the IGBT illustrated in FIG. 2A. Furthermore, both structures features a first and a second metallisation layer 13, 33, 14, 34 arranged on the first and second surface 11, 31, 12, 32 of the semiconductor substrate 1, 21, respectively.

Figure 2B:
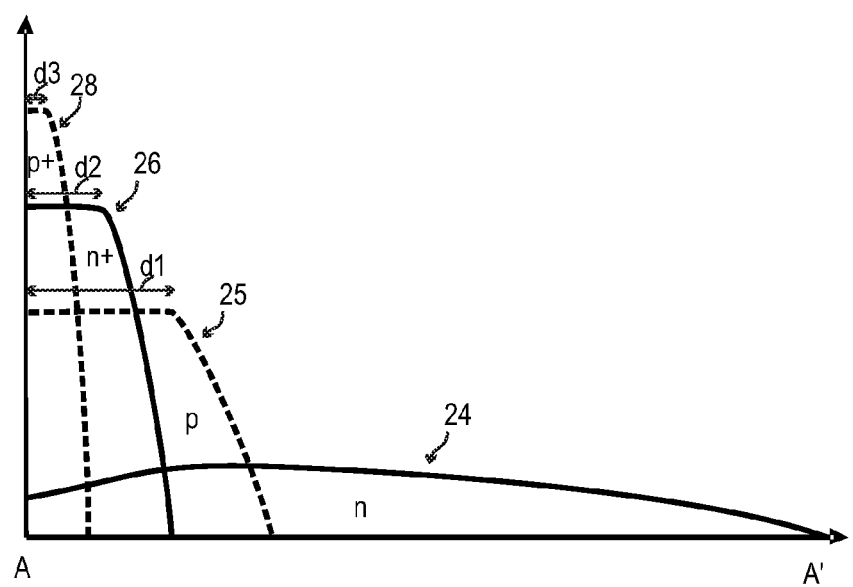
FIG. 2B illustrates a doping profile along line AA' in FIG. 2A.

The doping profile along line AA' in FIG. 2A, with point A being arranged at the second surface 32, is schematically illustrated in FIG. 2B. This doping profile includes in addition to the doping profile of FIG. 1B the highly p-doped emitter region 28 in certain embodiments. P-emitter region 28 can be considered as third doping region having a peak doping concentration located at a third depth d3 with respect to the second surface 32. Third depth d3 is smaller than second depth d2 corresponding to the location of the peak doping concentration of the n-buffer region 26, which can also be considered as second doping region. Peak doping concentration of the first doping region 25 formed by structured p-doped region 25 is arranged at first depth d1 which is larger than third depth d3 and second depth d2, respectively.

Figure 1C:
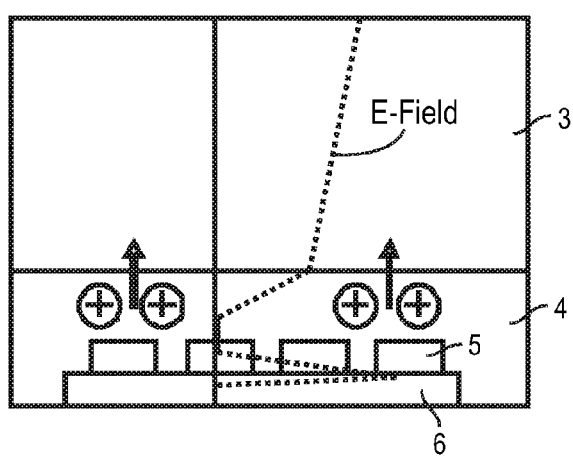
FIG. 1C illustrates the vertical course of the electric field through the diode of FIG. 1A.

The function of the structured p-doped region 5, 25, which can also be referred to as hole current generating region will be described next. When the diode is operated in forward mode, pn-junction J1, which forms the main pn-junction of the diode, is also in forward mode. Upon commuting the diode, i.e. switching the diode form the forward mode into the reverse mode by inversing the voltage applied between anode and cathode, the electric-field distribution dynamically changes, and high electrical field strength appear at the cathode side near the nn⁻-junction J2. At the same time, high electrical field strength occurs at pn-junction J1 which cause a pronounced avalanche-like generation of charge-carrier pairs that are separated in the high-field zone. Electrons moving to the cathode eventually reduce the electric field strength built up in the drift region 3. Since sustaining high electric field strength is desired to withstand the reverse voltage, a reduction of the electric field could result in a breakdown of the diode. On the other hand, the structured p-doped region 5 injects holes, when the electric field reaches the structured p-doped region 5. The injected holes partially compensate the electrons and thereby help to maintain a high electric field in the drift region 3. This situation is illustrated in FIG. 1C.

Basically, the same principle underlies the function of the structured p-doped region 25 in case of the IGBT as illustrated in FIG. 2A.

The openings 7, 27 or regions of opposite conductivity of structured p-doped region 5, 25 are typically regions which were masked during doping of p-doped region 5, 25. These 'undoped' regions, with regard to the p-doping of the structured p-region 5, 25, therefore maintain their original doping type and concentration or become n-doped during any subsequent doping process. For example, when the field stop region 4, 24 is formed prior to the formation of the structured p-doped region 5, 25, no reversal of the conductivity type occur in the region of the openings 7, 27. Since no p-doping occurs in those regions, field stop region 4 and n-emitter 6 remain in direct contact with each other through the openings 7. The same applies for the field stop region 24 and the n-buffer 26.

The structured p-doped region 5, 25 can have any layout as long as there is provided an n-doped electrical path between the n-emitter 6 and field stop region 4 in case of the diode or between n-buffer region 26 and field stop region 24 in case of the IGBT. FIGS. 3A and 3B illustrate embodiments of the structured p-doped region 5, 25 in a projection onto the second surface 12, 32. In both embodiments the structured p-doped region 5, 25 is formed by a connected p-region which can have openings 7, 27 or portions of opposite conductivity. FIG. 3A illustrates a simply connected p-region 5, 25, which is in projection onto the second surface 12, 32 smaller than the n-emitter 6 or the n-buffer 26, respectively. The openings or portions of opposite conductivity 7, 27 are therefore formed by the retracted edge of the structured p-doped region 5, 25 with respect to the lateral extension of the n-emitter 6 or n-buffer 26. The embodiment of FIG. 3B includes openings 7, 27 or portions of opposite conductivity 7, 27 which are completely surrounded by the structured p-doped region 5, 25. Although the structured p-doped region 5, 25 is illustrated in FIG. 3B to be laterally retracted from the edge of the n-emitter 6/n-buffer 26, it would also be possible that the structured p-doped region 5, 25 can have the same lateral extension as n-emitter 6/n-buffer 26 as long as there are provided openings or regions of opposite conductivity within the structured p-doped region 5, 25 for the electrical path.

Structured p-doped region, when projecting on the second surface 12, 32 may cover about 0.1% to about 99.9% of the total area assumed by the second surface 12, 32. This means 0.1% to about 99.9% are uncovered by the structured p-doped region 5, 25, i.e. this portion is assumed by the region or regions (openings or the rim) left uncovered by the structured p-doped region and contribute to the load current. In certain embodiments, structured p-doped region, when projecting on the second surface 12, 32 may assume about 50% to about 99.9% of the total area assumed by the second surface 12, 32.

In other embodiments, structured p-doped region 5, 25 has its peak doping concentration in a depth between about 0.5 μm to about 1 μm with respect to the second surface 12, 32. The doping regions arranged between the structured p-doped region 5, 25 and the second surface 12, 32, i.e. n-emitter 6 in case of a diode, and n-buffer 26 and p-emitter 28 in case of an IGBT, may have their peak doping concentration in a depth between 0.05 μm and 0.4 μm with respect to the second surface 12, 32.

A semiconductor device, according to one embodiment, can therefore include a semiconductor substrate 1, 21, having a first surface 11, 31, and a second surface 12, 32, wherein the second surface 12, 32 is arranged opposite to the first surface 11, 31. At least a first metallization layer 13, 33 is arranged on the first surface 11, 31. Furthermore, at least a first doping region of a first conductivity type is arranged in proximity to the second surface 12, 32. The first doping region can be formed by the field stop region 4, 24. At least a second doping region of a second conductivity type opposite to the first conductivity type is arranged in proximity to the second surface 12, 32. The second doping region can be formed by the structured p-doped region 5, 25. First and second doping regions have respective peak doping concentrations which are located at different depths with respect to the second surface 12, 32. A pn-junction such as pn-junction J3 in FIG. 1A or pn-junction 15 in FIG. 2A is formed between the first and the second doping regions. Moreover, the first doping region, when projecting onto the second surface 12, 32, can be one of a connected region having portions of the second conductivity type which are completely surrounded by the first doping region, and a simply connected region which is at last partially spaced to lateral edges of the semiconductor substrate 1, 21.

According to a modified embodiment, a third doping region of the first conductivity type can be arranged so that the second doping region is arranged between the first and the third doping region. The third doping region also forms a pn-junction with the second doping region. Third doping region can be for example n-emitter 6 or n-buffer 26. Third and first doping regions are in electrical contact which each other through regions of opposite conductivity such as lateral spaces 7, 27 arranged within the second doping region or within the level of the second doping regions, when seen in a cross-sectional view perpendicular to the second surface, to provide an electrical path between first and third doping region.

It should be noted here that first, second and third doping region can form different doping regions for different embodiments. For example, first doping region can be formed by structured p-doped region 5 while second doping region can be formed by n-emitter 6 in certain embodiments. In other embodiments, first doping region is formed by n-buffer 26 and second doping region by p-emitter 28. In further embodiments, first doping region may be formed by structured p-doped region 25 and second doping region by p-emitter 28. Other embodiments may include structured p-doped region 25 as first doping regions, n-buffer region 26 as second doping region, and p-emitter region 28 as third doping region.

Further embodiments of the structured p-doped region 5, 25 are illustrated in FIGS. 3C to 3E which includes a plurality of insulated p-portions forming together the structured p-doped region 5.

The doping regions arranged in proximity to the second surface 12, 32 of the semiconductor substrate 1, 21 needs to be tailored for improving the device characteristics. For manufacturing these doping regions, appropriate dopants are introduced into the semiconductor substrate 1, 21 typically from the second surface 12, 32. In many embodiments, the dopants are implanted to the desired depth and then activated by a thermal anneal. To improve the activation ratio a laser anneal is used after introducing the dopants. A laser anneal, as used in this specification, is a thermal annealing process which uses the radiation or beam of a laser source. The radiation or beam has a given energy density and is directed to the second surface 12, 32 for a given duration to cause the second surface 12, 32 of the semiconductor substrate 1, 21 to at least partially melt the semiconductor substrate at its radiated surface. Such radiation is referred to as laser pulse. A laser pulse may include multiple very short pulses if a single short pulse would not be sufficient to melt the second surface 12, 32 of the semiconductor substrate 1, 21. The melting duration and the melting depth, i.e. the depth to which the semiconductor substrate 1, 21 is melted, can be adjusted by appropriately selecting the energy density and the pulse duration. Typically, the pulse duration is rather short to ensure that the laser energy is substantially adiabatically absorbed by the semiconductor substrate. This means, that the pulse duration is sufficiently short enough so that the energy irradiated on, and absorbed by, the semiconductor substrate causes a short and strong heating of the irradiated surface without significant emission of heat radiation or heat transfer during the laser pulse. The heating is thus "restricted" to the irradiated surface. Furthermore, the wavelength may be considered since the absorption of the laser radiation is typically wavelength-dependent. In many embodiments, a short wavelength, typically less than 550 nm, or even less than 400 nm, is desired since radiation of such short wavelength is absorbed substantially completely within a few tens of nanometers which ensures that mainly regions close to the second surface 12, 32 adsorb the energy, see for example FIGS. 20A and 20B described further below. For example a XeCl excimer laser having a wavelength of 307 nm can be used. Other lasers can also be used such as nitrogen laser (337 nm), KrF excimer laser (248 nm), ArF excimer laser (193 nm), $F_2$ excimer laser (157 nm), XeBr excimer laser (282 nm), XeF excimer laser (251 nm) or Xe excimer laser (172 nm) to name few. These lasers are pulsed laser and provide sufficiently intensive and short laser pulses. An appropriate pulse duration, which is sufficiently short to avoid prolonged heating of the semiconductor substrate, is in the range of about 20 ns to about 10 ms, depending on the laser energy density. A skilled person will appreciate that the pulse duration is often defined by the laser type used. The pulse duration is therefore adjusted to select the appropriate energy transferred to the radiated surface to ensure that the radiated surface is melted to the desired depth without heating the remaining semiconductor substrate too much to avoid a temperature rise of the opposite surface above a critical temperature.

The use of at least one laser anneal allows the thermal annealing of doping regions at the second surface 12, 32 after forming the first metallization layer 13, 33 on the first surface 1, 31 without affecting the first metallization layer 13, 33. For example, aluminium or an aluminium alloy is typically used for the first metallization layer 13, 33 which melts at about 600 to about 700° C., typically only 400° C. being tolerable. To melt a semiconductor substrate, substantially higher temperatures are needed, in case of Si about 1400° C. A temporarily and localised heating of the second surface 12, 32 can be provided by the or each laser anneal without heating the first surface 11, 31 to temperatures higher than for example 400° C. Since the doping regions in proximity to the second surface 12, 32 can be formed after completing the first metallization on the first surface 11, 31 and after thinning the semiconductor substrate 1, 21, the number of manufacturing processes after thinning the semiconductor substrate 1, 21 can be reduced.

One or more embodiments include two or even three separate laser anneals, each of which appropriately designed for the respective doping region.

Appropriate manufacturing methods using at least one laser anneal allow a separate thermal treatment of the first and the second surface of the semiconductor substrate. The melting laser anneal results often in the formation of a plateau-like doping profile of the dopant, the activation ratio of which mainly depends on the used laser energy and the doping dose. Sharp or abrupt pn-junctions can be formed by laser annealing between oppositely doped doping regions. This improves the softness and robustness of power devices.

When melting the semiconductor substrate a very high activation ratio of the introduced dopants, i.e. introduced doping impurities or doping ions, can be achieved. The activation ratio is the ratio of the activated doping impurities to the total number of the introduced doping impurities. The total number of the introduced impurities corresponds to the chemical concentration of the doping impurities, and the activated portion corresponds to the number of doping impurities built into the lattice and occupying lattice sites of the semiconductor substrate. When expressed in percent, an activation ratio of about 50% to nearly 100% can be obtained. In certain embodiments, the activation portion can be in the range of about 85% to about nearly 100%. This significantly exceed the activation ratio obtained by low temperature furnace anneal, which for example results in about a 5% activation ratio when anneal at 400° C.

A melting laser anneal also provides a very high annealing ratio, i.e. annealing of lattice defects caused by the implantation of the dopants. The annealing ratio also significantly exceeds the annealing ratio obtained by non-melting furnace anneals.

It should be mentioned here that non-melting furnace anneals can also cause an adversely diffusion of the doping impurities which results in a broadening and flattening of doping profiles. Different thereto, a laser anneal is very short and causes significantly less or even does not cause any noticeable diffusion in non-melted areas. Therefore, doping profiles of already manufactured doping regions are not effected by the laser anneal. Within the melted portion of the semiconductor substrate, the mobility of the doping impurities is very high resulting in the formation of a plateau-like doping profile with nearly steep sidewalls which is unique for a melting laser anneal. Such plateau-like profiles are not obtainable with furnace anneals.

With respect to FIGS. 4 to 11 several embodiments pertaining to manufacturing processes are described. A common process to all embodiments is providing a semiconductor substrate having a first and a second surface, wherein the second surface is arranged opposite to the first surface. Further, a first metallization can be formed on the first surface before any implantation at the second surface but does not have to. Furthermore, the semiconductor material can be thinned at the second surface to reduce the total thickness of the semiconductor substrate. These additional and optional processes are typically performed prior to introducing dopants into the second surface. In the embodiments illustrated in FIGS. 4 to 11, the dopants are introduced into the semiconductor surface at the second surface by implantation unless otherwise stated.

The embodiments illustrated in FIGS. 4 to 11 include in case of a diode or FET the manufacturing of a first and a second doping region, which are of opposite conductivity type to each other, and in case of an IGBT the manufacturing of a first doping region of the first conductivity type, a second doping region of the second conductivity type and a third doping region of the first conductivity type. The peak doping concentration of the first doping region, when introduced into the semiconductor substrate, is located at a first depth, the peak doping concentration of the second doping region, when introduced into the semiconductor substrate, is located at a second depth and the peak doping concentration of the third doping region, when introduced into the semiconductor substrate, is located at a third depth. The respective depths are related to the second surface. First depth is larger than second depth which in turn is larger than third depth. Adjustment of the respective depths can be done in case of implantation by appropriately selecting the implantation energy IE under consideration of the mass of the dopants. Typically, the first doping region is formed by implanting a first dopant with first implantation energy IE1. Second doping region is formed by implanting a second dopant with second implantation energy IE2 while third doping region is formed by implanting a third dopant with third implantation energy IE3. In other words, first dopant is deeply implanted, second dopant is medium deeply implanted while a shallow implantation is used for implanting the third dopant. The implantation energies IE1, IE2 and IE3 are selected, under consideration of the mass of the respective impurity dopants, to achieve the above mentioned implantation depth relation. It should be noted here, that implantation depth, or depth of a doping region, is expressed with respect to the second surface of the semiconductor substrate.

Corresponding to the conductivity type of the doping regions, first dopant is of first conductivity type, second dopant is of second conductivity type and third dopant is of first conductivity type. Although first and third dopants are of the same conductivity type, different ions such as boron ions or aluminium ions can be used.

The embodiments can be modified to inverse the doping scheme or to use other doping schemes, for example n-n-p if desired.

In FIGS. 4 to 11, the doping profiles of doping regions are schematically indicated. The doping profiles of n-doped regions, corresponding to the second conductivity type, are indicated by solid lines and the doping profiles of p-doped regions, corresponding to the first conductivity type, are indicated by dashed lines.

The embodiments include manufacturing processes which are common for the manufacturing of a diode and an IGBT. Additional process needed for the manufacturing of an IGBT are indicated in the respective Figures.

Referring to FIG. 4, a first embodiment is described. At S41, a p-dopant is deeply implanted into the semiconductor surface at its second surface to form structured p-doped region, hereinafter referred to as structured p-region. In the following description, the implantation and the laser anneal takes place at the second surface unless otherwise states. For sake of simplicity, the second surface is referred to as surface unless otherwise stated. The resulting impurity profile of implanted ions S41-1 having a peak doping concentration at depth d1 is illustrated by the dashed line. Typically, the p-dopant, for example boron, boron fluoride or aluminium is implanted using first implantation energy IE1 to implant the p-dopant so that a doping region in a first depth of about 100 nm to about 5 µm is formed. A skilled person will appreciate that the implantation depth refers to the location of the peak impurity concentration since the doping ions have a given spatial distribution in the semiconductor substrate due to the inherent Gaussian energy distribution of the accelerated doping ions and their scattering within the substrate. Since the implanted dopant may undergo a melting laser anneal, the shape of the impurity profile obtained by implantation may significantly change so that the resulting concentration profile after anneal can significantly differ from the impurity profile. The selected implantation depth may take account of this so that final doping region after annealing has a vertical thickness between about 50 nm to about 5 µm and is arranged in a depth from about 50 nm to about 5 µm in case of a diode or a FET. In case of an IGBT and thyristor, the location is in a ranged from about 100 nm to about 5 µm since space for an additional backside emitter is needed.

At subsequent S42, a first laser anneal is performed to melt the surface substantially down to first depth d1. The melting results in a nearly 100% activation of all implanted doping ions. The resulting doping profile S42-1 of structured p-region is schematically indicated next to S42 in FIG. 4. During melting, the implanted ions have a high mobility within the melted portion of the semiconductor substrate so that the ions substantially can uniformly distribute within the melted portion to a certain extent. This results in the formation of the plateau-like doping profile S42-1. The location of the steep drop S42-2 of the doping profile substantially corresponds to the melting depth. Therefore, by selecting the laser energy the vertical extension and depth of the doping profile S42-1 can be adjusted.

Although the annealed doping profile schematically illustrate a flat plateau having an extended area of maximum doping concentration, the maximum doping concentration is assumed to be arranged at the centre of the plateau or even close to the onset of the steep drop.

It has been confirmed experimentally, see discussion below to FIGS. 15A to 15C and 19, that the laser anneal results in a plateau-like doping profile when melting down to the depth of the peak doping concentration or even deeper. If the melting depth is smaller than the depth of the peak impurity concentration, a plateau-like doping profile with an increase in doping concentration below the melting depth might be obtained. Such profiles can be of interest for certain applications.

In S43 n-dopant (second conductivity) such as phosphorus or arsenic is implanted into a second depth d2 which is smaller than the first depth d1 to form the n-emitter of the diode and the n-buffer of the IGBT. Hence, second implantation energy IE2 used for implanting the n-dopant is chosen such that the corresponding second implantation depth d2 is smaller than the first implantation depth d1 used for implanting the p-dopant. Typically, the n-dopant is implanted into a depth of about 0 nm to about 1 µm in case of a diode or a FET and into a depth of about 50 nm to about 1 µm in case of an IGBT or thyristor. The resulting profile of implanted ions S43-1 having a peak impurity concentration at d2 is illustrated next to S43.

A second laser anneal is performed in S44 to melt the semiconductor substrate substantially down to the second depth d2 or deeper. Again a plateau-like doping profile S44-1 is obtained. Since the melting depth of the second laser anneal is less than the melting depth of the first laser anneal, a higher doping concentration can be obtained even when the same amount of ions were introduced. To further increase the doping concentration of the n-emitter/n-buffer with respect to the structured p-region the implantation dose can be increased.

Structured p-region corresponds to the structured p-doped region 5, 25 as described in connection with FIGS. 1A and 2A and may correspond to the first doping region. When implanting the p-dopant, an implantation mask is typically used to laterally structure the structured p-region. It should be mentioned here that the lateral dimension of structures such as openings 7 of the structured p-region 5, 25 is, for example, in the range of few micrometers or above. The location and formation of these structures are not significantly affected by the laser anneal since the melting duration is too short to allow perceptible diffusion of the dopant to such an extent. For maintaining the structures, as a rule of thumb, the lateral dimension of the structures such as openings 7 of the structured p-region 5, 25 should be about at least equal to or larger than the intended melting depth. In certain embodiments, the lateral dimension can be also significantly larger than the intended melting depth according to specific needs. N-emitter 6 of diode or n-buffer 26 of IGBT may correspond to second doping region. It should be mentioned here that also a structured p-doped region with edges retracted from the rim of the semiconductor device as illustrated in FIG. 3A can be formed.

The S41 to S44 are common for the manufacturing of a diode, FET, thyristor and IGBT. Since both an IGBT and a thyristor have an additional pn-junction at the second surface, a p-emitter region is subsequently formed which corresponds to the p-emitter 28 as described above.

The p-emitter is formed by implanting a p-dopant (first conductivity type), for example boron, boron fluoride or aluminium, using a third implantation energy IE3 chosen such that the corresponding implantation depth d3 is smaller than the second implantation depth d2. The implantation depth d3 is typically about 0 nm to about 500 nm. The resulting distribution of implanted ions S45-1 is illustrated.

Subsequently, a third laser anneal can be performed at S46a which melts the semiconductor substrate only down to about the third depth d3. This results in the doping profile S46-1. In one embodiment, a low temperature anneal can be used (S46b) to activate the implanted dopant without significantly affect the shape of the doping profile. The low temperature activation may include a furnace at, for example about 400° C. It would also be possible to use another furnace process which might be required by any subsequent process, for example for annealing a second metallisation layer which is finally deposited onto the second surface after implantation of the doping regions. In one embodiment, the activation process to activate the field stop layer as described above can be utilized to activate the p-dopant.

Generally, the impurity concentration of the p-emitter is larger than the impurity concentration of the n-buffer, which is in turn larger than the impurity concentration of the structured p-region. The selected implantation doses for the respective implantations therefore take account of the vertical extension of the respective doping regions and the desired final doping concentration. Typical examples are for the doping concentration of the p-emitter from about $10^{16}/cm^3$ to about $10^{20}/cm^3$, for the n-buffer/n-emitter from about $10^{15}/cm^3$ to about $10^{19}/cm^3$, and for the structured p-region from about $10^{16}/cm^3$ to about $10^{19}/cm^3$.

According to the embodiment illustrated in FIG. 4, a laser anneal is performed after each implantation wherein the deepest implantation is performed first and the most shallow implantation last. The laser energy used for each annealing process is adjusted for the desired melting depth. If the laser energy is denoted by E1, E2 and E3 for the first, second and third laser anneal, respectively, than E3<E2<E1. First doping region formed by the first dopant may therefore be considered as structured p-region while second doping region formed by second dopant may be considered as n-buffer/n-emitter region.

In certain embodiments, p-emitter may have a vertical extension from about 50 nm to about 500 nm. In these or other embodiments, n-buffer/n-emitter may have a vertical extension from about 50 nm to about 1 μm. In these or other embodiments, structured p-doped region may have a vertical extension from about 50 nm to about 5 μm. A skilled person will appreciate that the actual vertical extension and location of the respective doping regions can be tailored for different devices to improve the device's performance.

Referring to FIG. 5 a further embodiment will be described. S51 to S53 of this embodiment correspond to the S41 to S43 of the embodiment illustrated in FIG. 4. For completing the diode, low temperature activation is used in S54 instead of using a laser anneal as in process 44. Therefore, the resulting doping profile of the n-emitter remains peak-shaped.

For manufacturing the IGBT, S53 is performed without any anneal. After implanting the n-buffer, the p-emitter is implanted in S55. Subsequently n-buffer and p-emitter are annealed either using a common laser anneal (S56a) or a low temperature furnace anneal (S56b). The common laser anneal can melt the semiconductor surface down to the second depth d2 only or down to the third depth d3 only. In the first case, although both doping regions are melted at the same time, it has been observed that not a complete mixing of both profiles occurs. In the second case, the resulting doping profile S56-2, for example, illustrates for the n-buffer a plateau in proximity to the second surface with an adjacent concentration peak before the doping concentration decreases sharply. This is the result of a partial melting of the n-buffer which did not reach the second depth d2. Therefore, the location and shape of the peak is not affected by the laser anneal. The doping profile of the p-emitter after the laser anneal is denoted by S56-1 while after the furnace by S56-3. The annealed doping profile of the structured p-region is denoted by S52-1 and the doping profile of the n-buffer by S53-1.

The embodiment illustrated in FIG. 5 therefore includes at least one laser anneal with energy E1 for annealing the deepest implantation (structured p-region). No further laser anneal is used for manufacturing the diode while a further laser anneal with energy E3 can be used for the IGBT with E3<E1. In this embodiment, the first doping region formed by a first dopant may correspond to the structured p-region 25 while the second doping region formed by a second dopant may correspond to the p-emitter 28.

A further embodiment is described in connection with FIG. 6. Here, first and second implantations to manufacture structured p-region and n-emitter or n-buffer, respectively, are made before any anneal. The order of the implantation can be selected according to specific needs. Then, n-emitter/n-buffer having doping profile S62-1 is laser annealed by melting the semiconductor substrate substantially down to the second depth only. This means that the structured p-region is not annealed by melting but only thermally so that its impurity profile S61-1 is substantially not affected by the laser anneal. The laser anneal results in the formation of a plateau-like doping profile S63-1 of the n-emitter/n-buffer. After S63, the manufacturing of the diode, as far as the formation of doping regions is concerned, is finished.

For completing the IGBT, the p-emitter is subsequently implanted at S64 resulting in impurity profile S64-1 and then either laser annealed at S65a resulting in doping profile S65-1 or in one embodiment activated by a low temperature furnace at S65b which substantially does not affect the shape of the impurity and hence the final doping profile.

In this embodiment, only the n-emitter/n-buffer is laser annealed with laser energy E2 which is smaller than energy E1 which would be needed to anneal completely the structured p-region. The p-emitter can be laser annealed using energy E3 or activated by low temperature furnace, with E3<E2. In this embodiment, n-buffer may correspond to the first doping region formed by a first dopant while p-emitter may correspond to the second doping region formed by a second dopant. Structured p-region may correspond to the further doping region.

Figure 7:
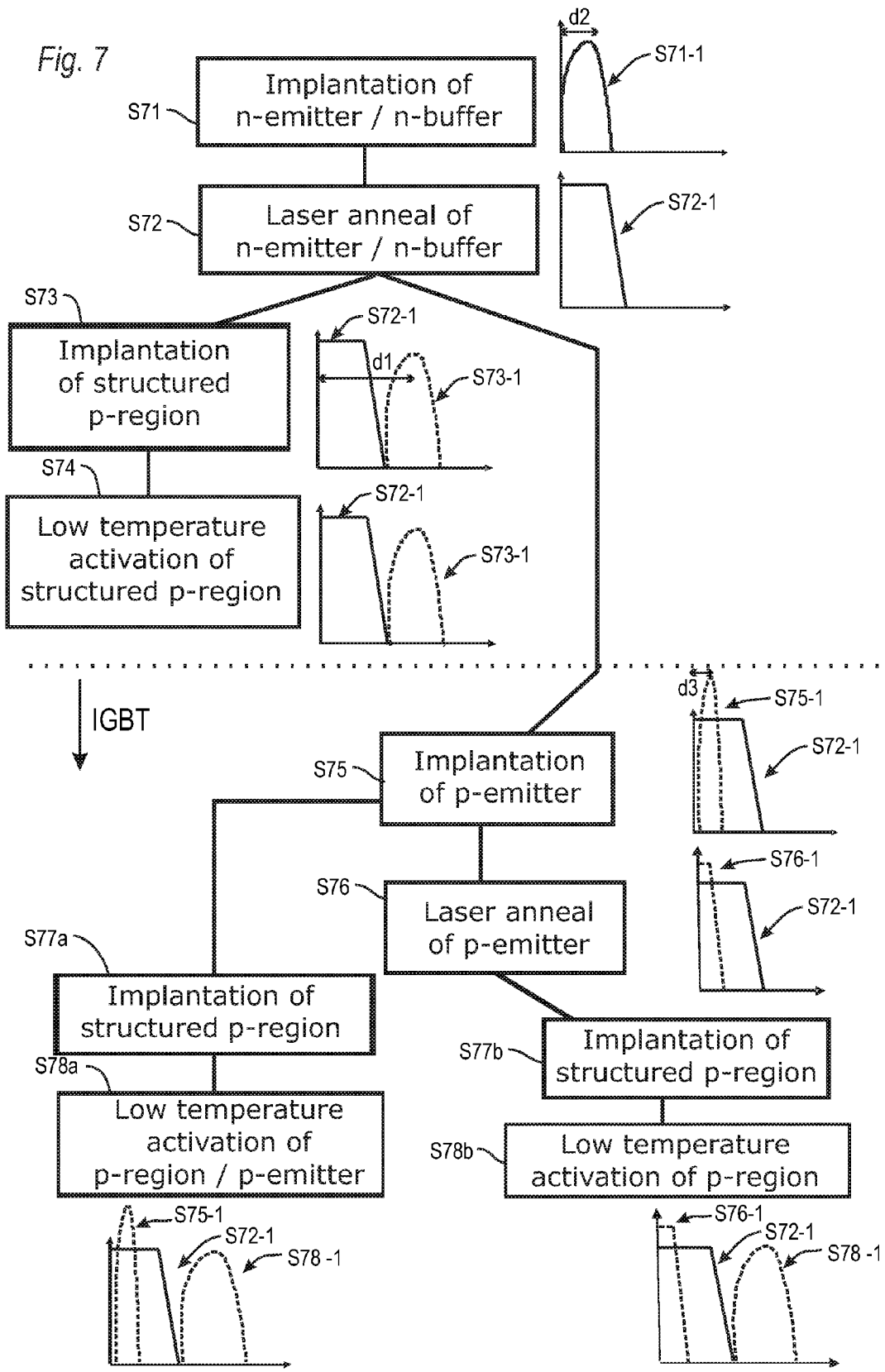
FIG. 7 illustrates processes of a method for manufacturing a diode and an IGBT according to one embodiment.

A further embodiment is illustrated in FIG. 7 which includes implantation of the p-dopant for forming structured p-region after formation of the n-emitter in case of the diode and after formation of n-buffer and p-emitter in case of the IGBT. First, an n-dopant is implanted at S71 into depth d2 resulting in a peak doping profile S71-1. Subsequently, the thus formed n-emitter/n-buffer is laser annealed at S72 by a first laser anneal resulting in the formation of plateau-like doping profile S72-1.

The processing for the diode continues at S73 with the subsequent implantation of a p-dopant resulting in profile S73-1 which is furnace annealed at low temperature at S74.

For manufacturing the IGBT S75 follows S72 with the implantation of a p-dopant into depth d3, which is smaller than depth d2, resulting in the doping profile S75-1. Then the thus implanted p-emitter can be laser annealed at S76 by a second laser anneal to obtain doping profile S76-1. In one embodiment, S76 can be omitted. In both cases, the p-dopant is implanted at S77a/S77b into depth d1, which is larger than depth d2. S77a/S77b corresponds to S73 for the diode. In case S77a, impurity and hence doping profile S75-1 remains peak-shaped. Subsequently, a low temperature anneal corresponding to the anneal of S74 is performed at S78a/S78b which either activates the structured p-region only in case that the p-emitter underwent a laser anneal or activates both the first and the third doping regions if no second laser anneal were carried out. In either case, the doping profile of the structured p-region is peak-shaped. The last low temperature anneal also anneals defects which might be caused by the deep implantation of the p-dopant.

First laser anneal uses energy E2 which is larger than energy E3 for the second anneal. However, energy E2 is not large enough to cause a melting of the substrate down to the first depth d1.

In this embodiment, implantation of n-dopant for forming the n-buffer can also be considered as first dopant which is implanted into a first depth. Furthermore, p-dopant used for implanting the p-emitter can be considered as second dopant which is implanted into a second depth. This shall illustrate that the specific wording used for describing the embodiments shall not be used to construe the claims in a limiting sense.

Figure 8:
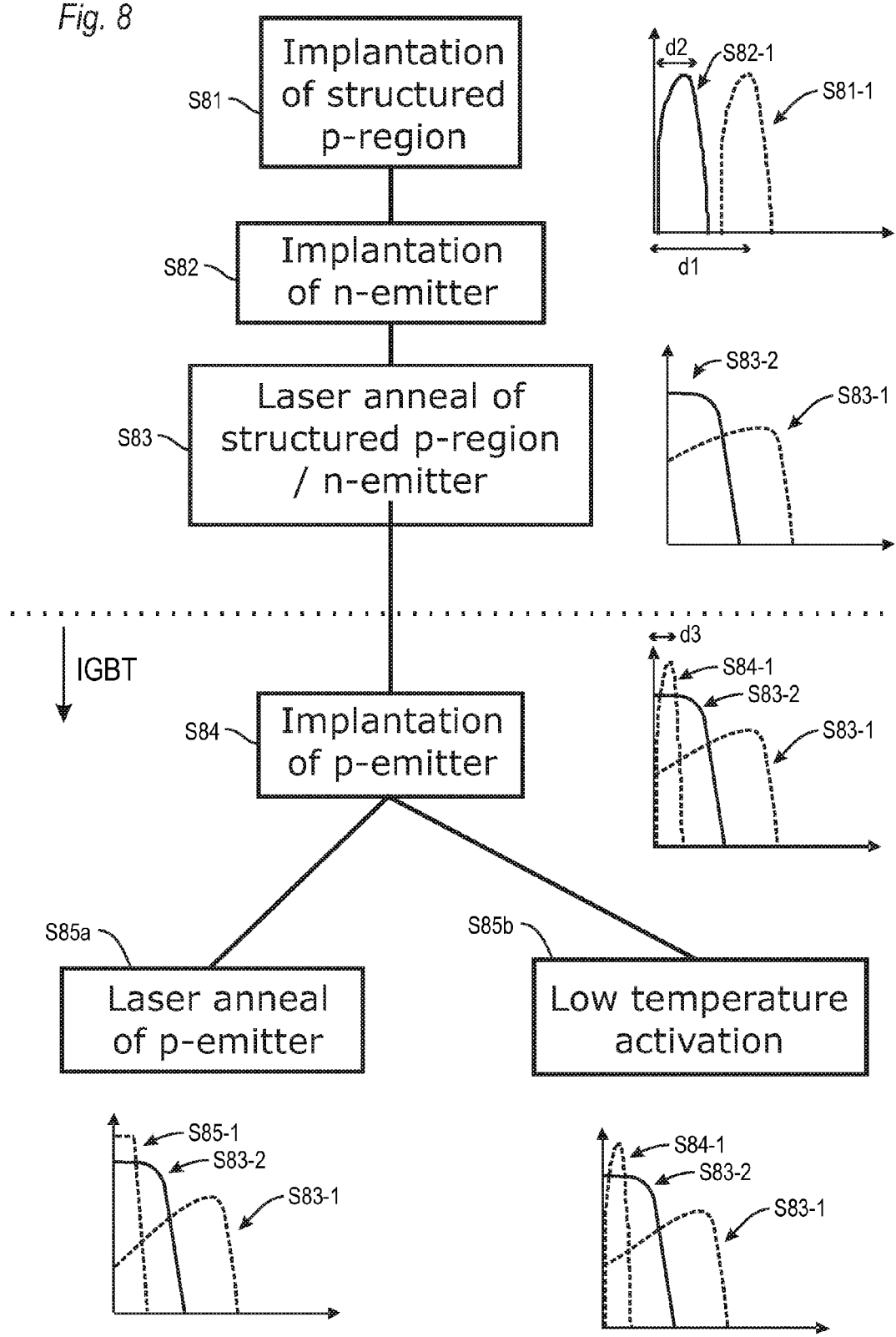
FIG. 8 illustrates processes of a method for manufacturing a diode and an IGBT according to one embodiment.

Another embodiment is described in connection with FIG. 8. The process starts with steps S81 and S82 pertaining to the implantation of p- and n-dopants at depth d1 and d2, respectively. The order of implantation can be selected according to specific needs although typically the deepest implantation (p-dopant) is carried out first to avoid interference with already doped ions. The resulting impurity profiles are indicated with S81-1 (structured p-region) and S82-1 (n-emitter/n-buffer). Subsequently, a common first laser anneal is performed. Since the doping profile obtained with laser annealing is not completely flat, it is possible to use a single melting laser anneal to anneal both doping regions. A pn-junction will be formed if the peak doping concentrations of the implanted profiles are at different depth. It has been observed that a given vertical distance between the impurity profiles ensures that the doping profiles do not completely mix during laser annealing. As a rule of thumb, the vertical distance between peaks of the impurity profiles of adjacent doping regions should be larger than $\frac{1}{2}(\sigma 1-\sigma 2)$, wherein $\sigma 1$ and $\sigma 2$ are the width of the impurity distribution profile at respective impurity concentrations $c1=1/e*c1_{peak}$ and $c2=1/e*c2_{peak}$ with $c1_{peak}$ and $c2_{peak}$ corresponding to the maximum impurity concentrations of the respective impurity profiles. If, for example, a Gaussian distribution is assumed for the respective impurity profiles, $\sigma 1$ and $\sigma 2$ correspond to the standard deviation of the respective impurity profiles. A skilled person will appreciate that the implantation profiles are typically not Gaussian but non-symmetrical.

The resulting doping profiles after laser annealing are denoted with S83-2 for the n-emitter/n-buffer and with S83-1 for the structured p-region. Starting from the surface, the doping concentration of the shallow n-emitter remains substantially constant to a given depth before sharply decreases. Different thereto, the concentration of the structured p-region significantly decreases close to the surface due to the laser anneal and reach a maximum at a location corresponding to the location of its peak after implantation.

Hence, common laser anneal using energy E1, which is sufficient to melt the semiconductor substrate substantially down to d1 and to anneal both doping regions, is used in this embodiment.

For completing the IGBT, a p-dopant is implanted by a shallow implantation into depth d3 at S84 resulting in a peak-shaped doping profile S84-1. Subsequently, either a second laser anneal with energy E3 is used at S85a to laser anneal the p-emitter only or a low temperature activation process is used at S85b. Second laser anneal results in the formation of plateau-like doping profile S85-1. Energy E3 is sufficiently small to melt the semiconductor substrate down to the third depth d3 only which avoids affecting the already annealed doping profiles S83-2 and S83-1 and particularly the location of the pn-junction formed between the structured p-region and n-emitter/n-buffer.

Figure 9:
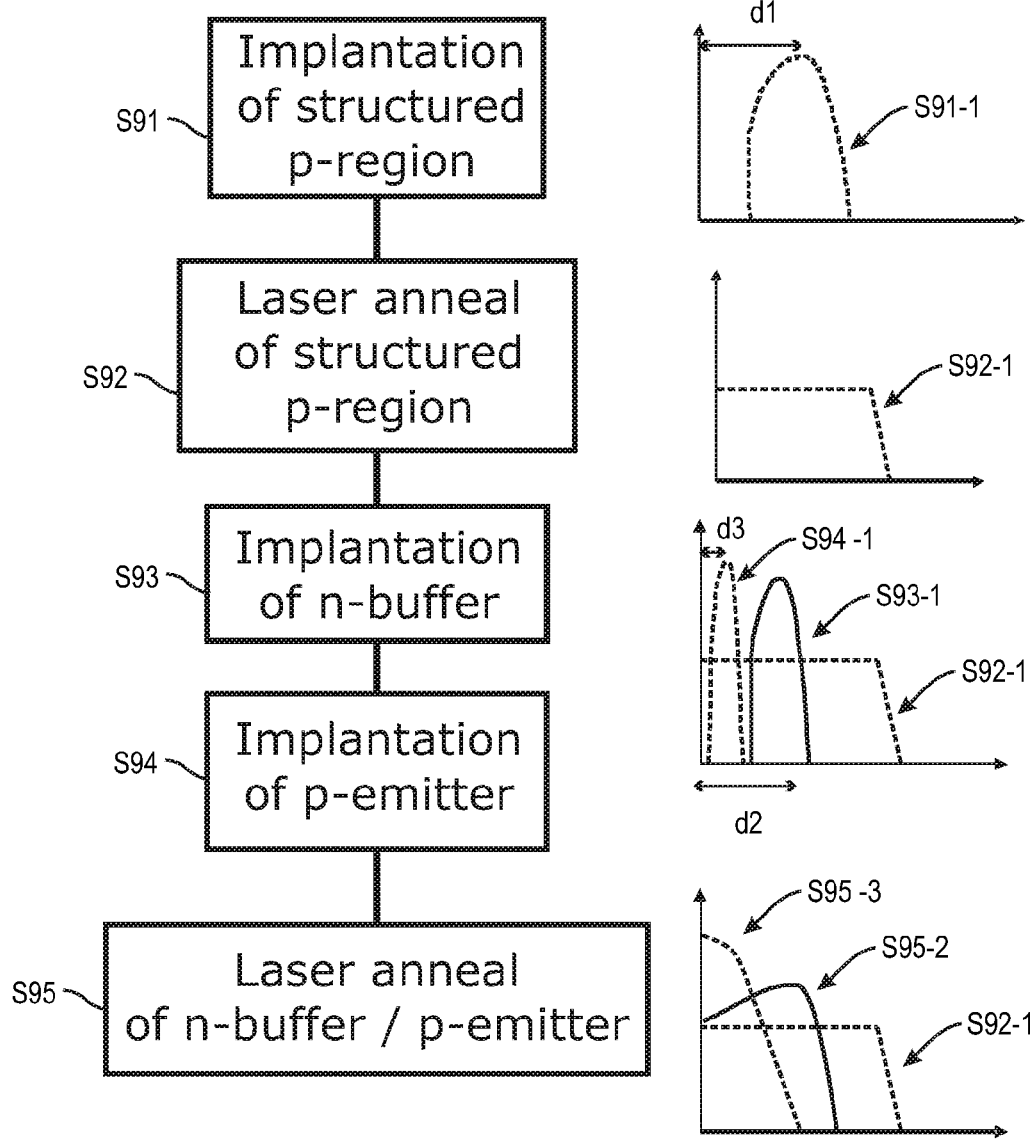
FIG. 9 illustrates processes of a method for manufacturing an IGBT according to one embodiment.
Figure 10:
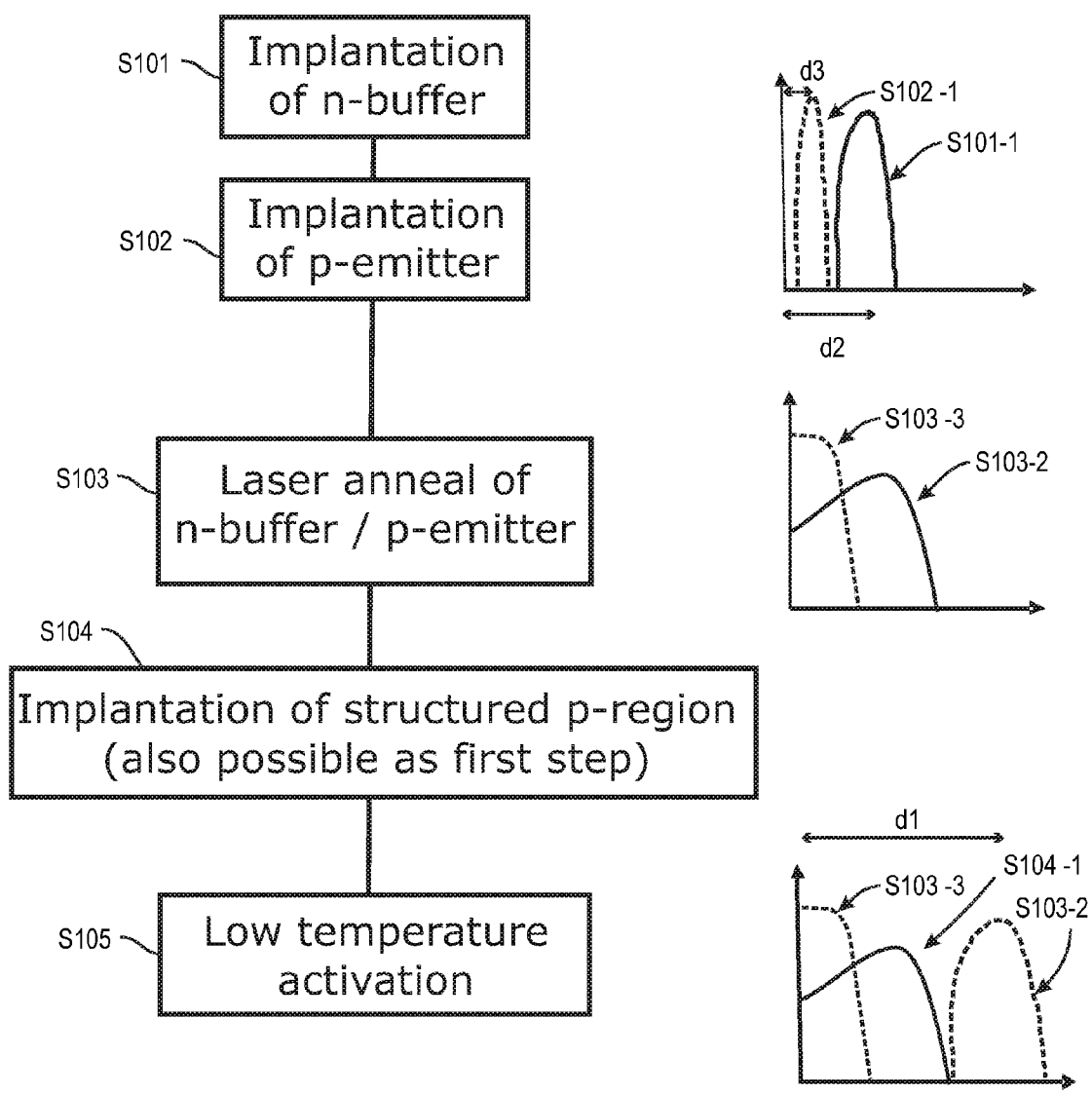
FIG. 10 illustrates processes of a method for manufacturing an IGBT according to one embodiment.

The next embodiments illustrated in FIGS. 9 and 10 pertain to the manufacturing of an IGBT only. Both embodiments include a common laser annealing process for the n-buffer and p-emitter, i.e. the doping regions which are located in close proximity to the second surface. The deep first implantation can be separately laser annealed or furnace annealed.

The embodiment of FIG. 9 starts, as the embodiments of FIGS. 4 and 5, with a deep implantation of a p-dopant into depth d1 at S91 and a subsequent laser anneal using energy E1, which is sufficient to melt the semiconductor substrate down to depth d1, at S92. The corresponding impurity profile after implantation is denoted by S91-1 and the doping profile after laser anneal by S92-1.

Subsequently, n- and p-dopants are implanted into their respective depth d2 and d3 (S93 and S94), wherein d3<d2<d1, and a common laser annealing process is performed at S95. Laser energy E2 is used which is sufficient to allow melting of the semiconductor substrate down to second depth d2. This results in the formation of doping profile S95-2 for the n-buffer and S95-3 for the p-emitter. Energy E2 is less than energy E1.

Embodiment of FIG. 10 starts with the successive implantation of n- and p-dopants to form n-buffer (for example second doping region) and p-emitter (for example third doping region) at depth d2 and d3, respectively. The resulting doping profiles are denoted by S101-1 for n-buffer and S101-2 for p-emitter. S101 and S102 correspond to S93 and S94 of FIG. 9. Subsequently, a common laser anneal as in S95 of embodiment of FIG. 9 is performed at S103. The resulting doping profiles are denoted by S103-2 for the n-buffer and S103-3 for the p-emitter. Finally, the structured p-region (for example first doping region) is formed by implanting a p-dopant into depth d1 at S104 and activating it by a low temperature activation process (S105). In one embodiment, p-dopant (first dopant) can also be implanted first followed by the implantation of the n-dopant (second dopant) and p-dopant (third dopant) so that the deep implantation does not affect the annealed profile of the n-buffer and p-emitter. In this case, low temperature activation of the structured p-region can be performed directly after the implantation of the first dopant or after laser annealing of the n-buffer and p-emitter. The peak-shaped doping profile of the structured p-region is indicated by S104-1.

Embodiment illustrated in FIG. 11 also pertains to the manufacturing of an IGBT and starts with the implantation, in this order, of a p-dopant into depth d1 (S111), an n-dopant into depth d2 at S112, and a p-dopant into depth d3 at S113. Other orders of implantation would also be possible. Then a laser anneal of the p-emitter is performed at S114 using energy E3 adjusted to melt the semiconductor substrate down to about depth d3 only. The laser annealed doping profile of the p-emitter is denoted by S114-1 while the peak-shaped impurity profile of the structured p-region is denoted by S111-1 and that of the n-buffer by S112-1. Finally, a low temperature anneal is used to activate the dopants of n-buffer and structured p-region.

In the embodiment of FIG. 11, the laser anneal is only used to anneal the p-dopant, which can correspond to either the first or second, used to form the p-emitter while the other doping regions are annealed by a low temperature anneal only. Therefore, S111 and S112 could also follow S114 but before S115.

The description of the embodiments illustrated in FIGS. 4 to 11 uses specific language such as first, second and third dopants and first, second and third depth. This specific language was used for illustration purposes only but not to restrict the appending claims.

It should be reminded here that structured p-region in the embodiments illustrated in FIG. 4 to 11 corresponds to the structured p-doped region 5, 25 of FIGS. 1A and 2A while the n-buffer/n-emitter corresponds to the n-emitter 6 of FIG. 1A or the n-buffer 26 in FIG. 2A. Furthermore, p-emitter corresponds to the p-emitter 28 of FIG. 2A. A skilled person will appreciate that the processes illustrated in FIGS. 4 to 11 can also be used for manufacturing other devices different to a diode and an IGBT. For example, a vertical FET or a thyristor can also benefit from the described methods.

According to other embodiments, a semiconductor substrate is provided which includes a first surface and a second surface, wherein the second surface is arranged opposite to the first surface. A first dopant is introduced into the semiconductor substrate at the second surface such that its peak doping concentration in the semiconductor substrate is located at a first depth with respect to the second surface. A second dopant is introduced into the semiconductor substrate at the second surface such that its peak doping concentration in the semiconductor substrate is located at a second depth with respect to the second surface, wherein the first depth is larger than the second depth. At least a first laser anneal is performed by directing at least one laser beam pulse onto the second surface to melt the semiconductor substrate, at least in sections, at the second surface. According to further embodiments, the second dopant is introduced after the first dopant. Furthermore, the first laser anneal is performed after introducing the first dopant and before introducing the second dopant. In further embodiments, at least a second laser anneal is performed by directing at least a further laser beam pulse onto the second surface to melt the semiconductor substrate, at least in sections, at the second surface, wherein the second laser anneal is performed after introducing the second dopant. Moreover, the laser beam pulse of the first laser anneal is performed with a first energy density, and the laser beam pulse of the second laser anneal is performed with a second energy density, wherein the first energy density is larger than the second energy density. In other embodiments, first dopant is introduced after introducing the second dopant and after performing the first laser anneal. In further embodiments, the first laser anneal is performed after introducing the first and the second dopant into the semiconductor substrate.

In other embodiments, a semiconductor substrate is provided which includes a first surface and a second surface, wherein the second surface is arranged opposite to the first surface. A first dopant is introduced into the semiconductor substrate at the second surface such that its peak doping concentration in the semiconductor substrate is located at a first depth with respect to the second surface. At least a laser anneal is performed by directing at least one laser beam pulse onto the second surface to melt the semiconductor substrate, at least in sections, at the second surface. A second dopant is introduced into the semiconductor surface at the second surface such that its peak doping concentration in the semiconductor substrate is located at a second depth with respect to the second surface, wherein the first depth is larger than the second depth. After introducing the first and second dopants and after performing the laser anneal, at least a non-melting anneal is performed. In further embodiments the laser anneal is performed after introducing the first dopant and before introducing the second dopant. In yet other embodiments, the second dopant is introduced before the first dopant, and the laser anneal is performed after introducing the second dopant and before introducing the first dopant. In further embodiments, the laser anneal is performed after introducing the first and second dopants.

Figure 12:
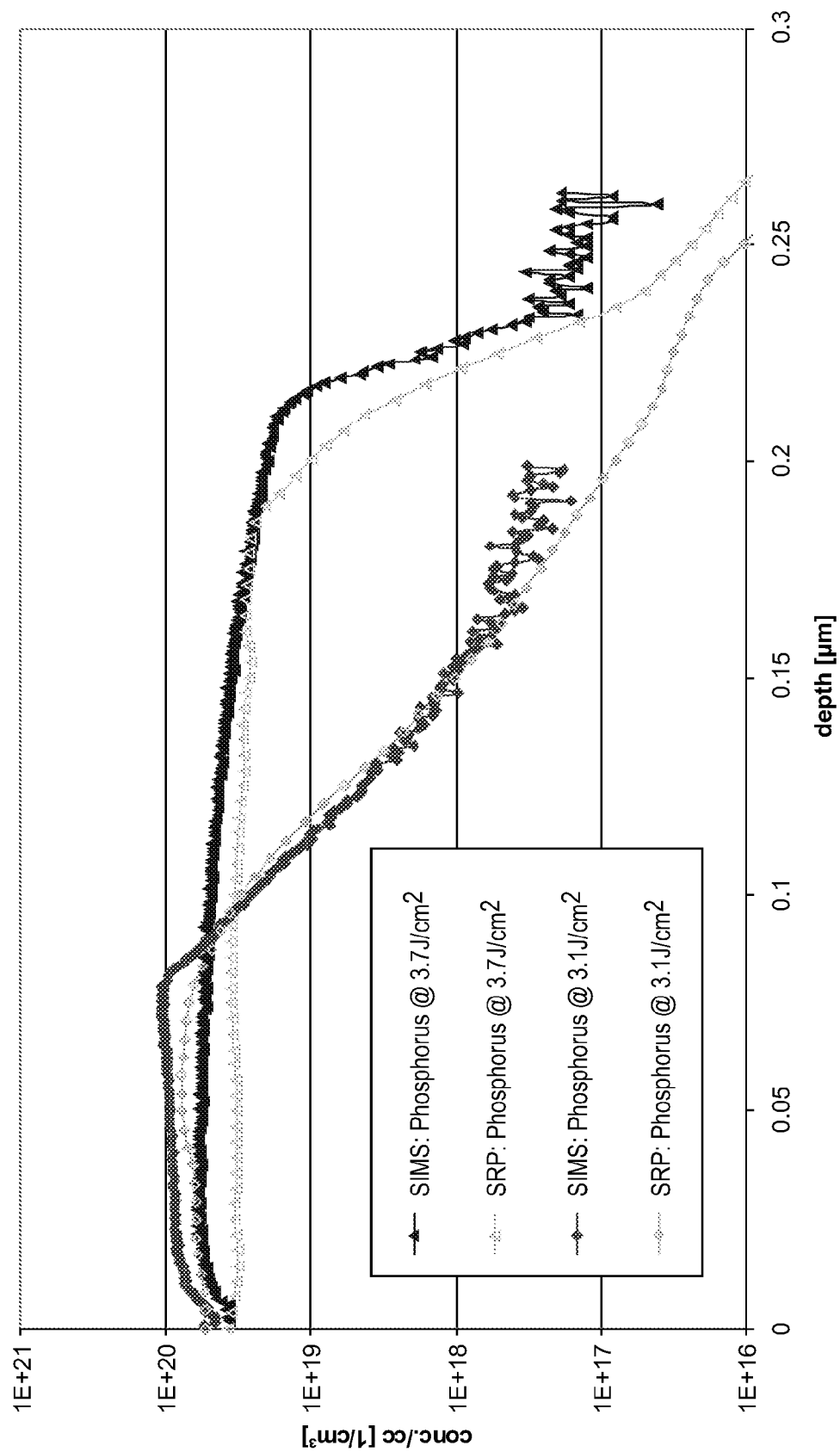
FIG. 12 illustrates phosphorus concentration and doping profiles after phosphorus implantation at constant implantation energy and annealing at different laser energy densities.

FIG. 12 illustrates a comparison between the doping profiles of doping regions annealed with different laser energies. Both doping regions were implanted using the same implantation energy and the same implantation dose. The concentration profiles are obtained by SIMS (secondary ion mass spectroscopy) and the doping profiles by SRP (spread resistance profile), respectively. With SIMS the chemical or impurity concentration of the dopants can be determined while SRP-measurements are used to determine the proportion of the electrically activated dopants. In both examples the melting depths roughly correspond to the onset of a sharp decrease of the doping concentration adjacent a substantially constant doping concentration region forming a plateau-like area. An about 150 ns short laser pulse of a XeCl excimer laser was used to anneal the samples. The used laser energy densities for the respective anneals are indicated. As it becomes apparent from FIG. 12, the activation ratio is nearly 100%. The location of the concentration drop apparently depends on the melting depth. It is believed, without wishing to be tied to theory, that the implanted impurities roughly uniformly distribute within the melted portion of the semiconductor substrate so that a sharp drop down to the doping concentration defined by the implantation is formed at the maximum melting depth. This could be a result of the advancing melting front "pushing" the implanted impurities towards greater depth.

Figure 13:
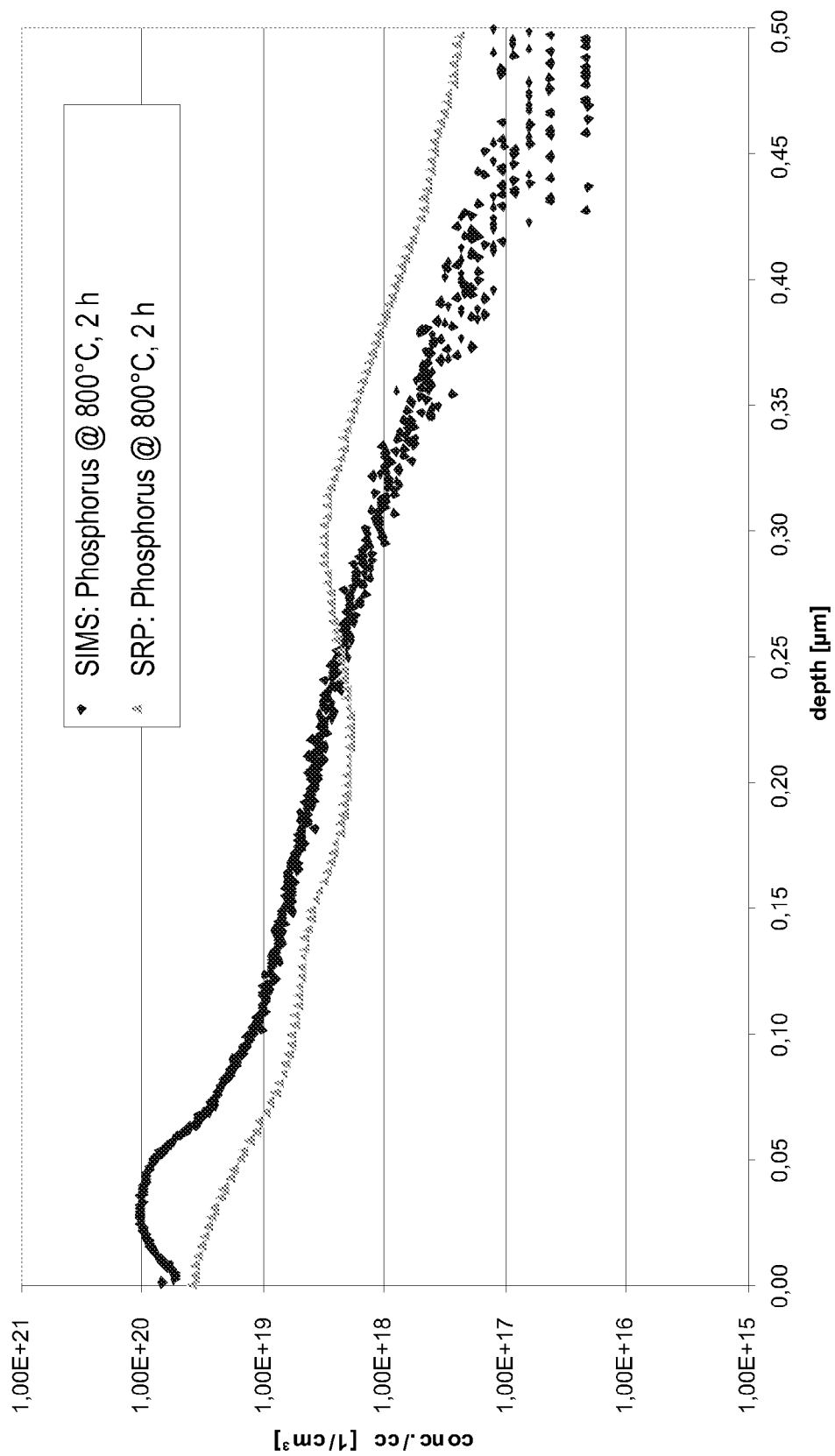
FIG. 13 illustrates the phosphorus concentration and doping profile obtained after performing a furnace anneal.

For comparison, reference is made to FIG. 13 illustrating the SIMS and SRP profiles of a sample which was subjected to a furnace anneal at 800° C. for 2 h. The same implantation energy and implantation dose as for the samples of FIG. 12 were used. The small peak illustrated in the SIMS profile apparently corresponds to the implantation depth. When comparing FIG. 12 with FIG. 13 it becomes apparent that the activation ratio of the laser anneal is higher than that of the furnace. Furthermore, FIG. 13 illustrates the typical slow decrease of the implanted impurities caused by diffusion. With the laser anneal, a plateau-like profile can be fabricated; the width of the plateau can be controlled by the irradiated laser energy.

Figure 14:
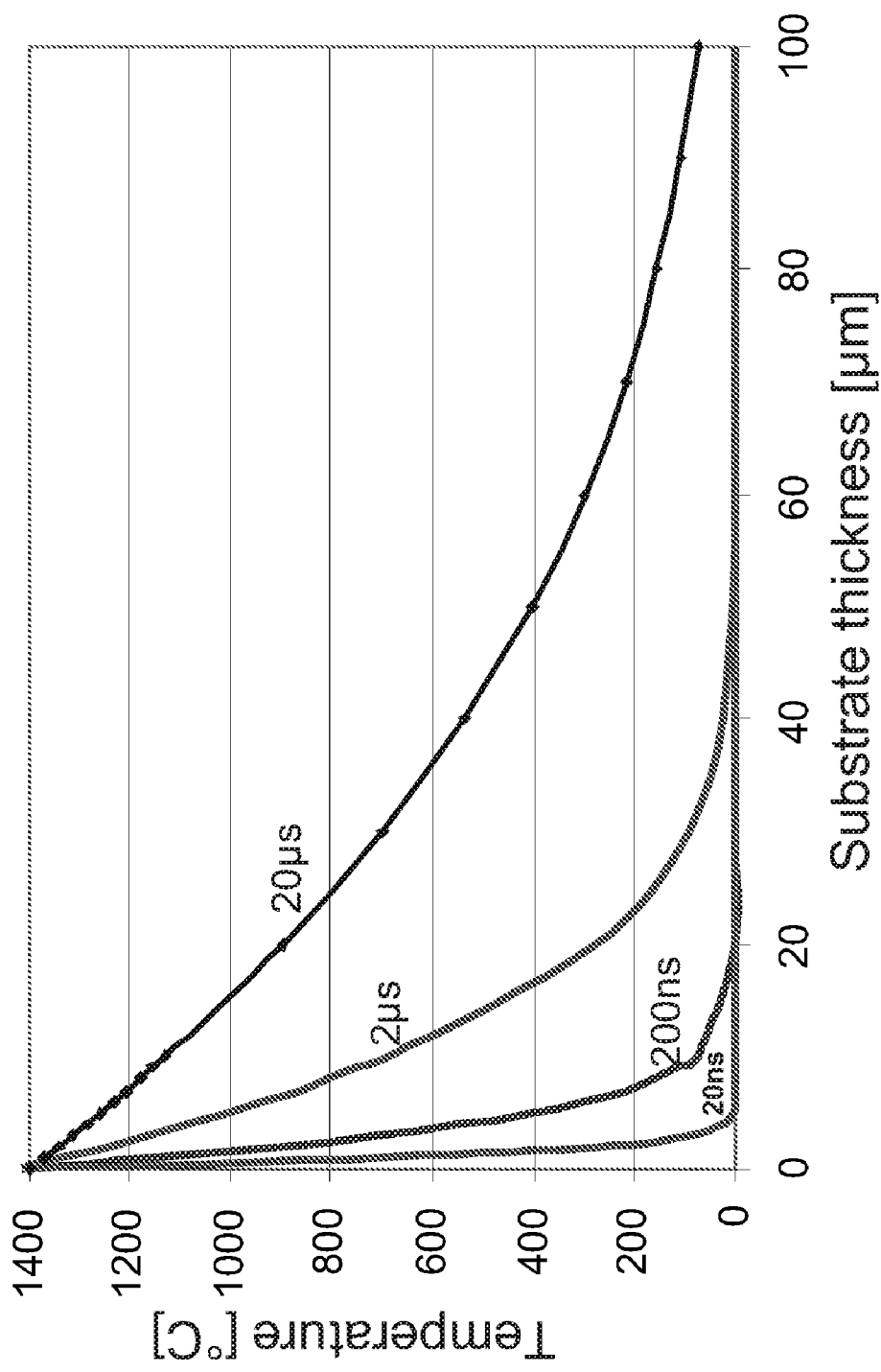
FIG. 14 illustrates the simulation result for estimating the temperature of the semiconductor substrate at different laser beam pulse widths.

FIG. 14 illustrates simulation results for determining the temperature raise of the substrate at different laser pulse durations as a function of the depth. As illustrated, very short pulses restrict the temperature increase to regions close to the irradiated surface. In this simulation, the boundary condition that the temperature at the irradiated surface reaches and remains at 1400° C., corresponding to the melting temperature of Si, was used. It is, however assumed, that the temperature at the irradiated surface can exceed the melting temperature.

Figure 15A:
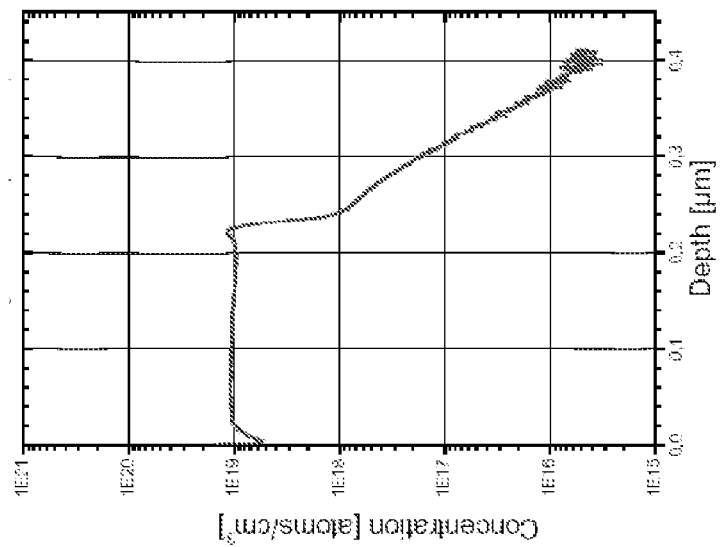
FIGS. 15A to 15C illustrate the impurity profile of a shallow implantation without any anneal (FIG. 15A), the concentration profile of a shallow implantation after a laser anneal (FIG. 15B), and the concentration profile of a deep implantation after a laser anneal (FIG. 15C).
Figure 15B:
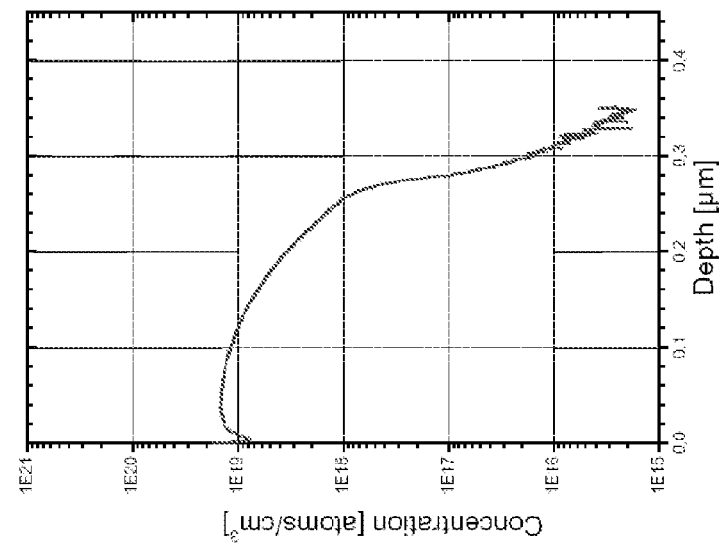
Figure 15C:
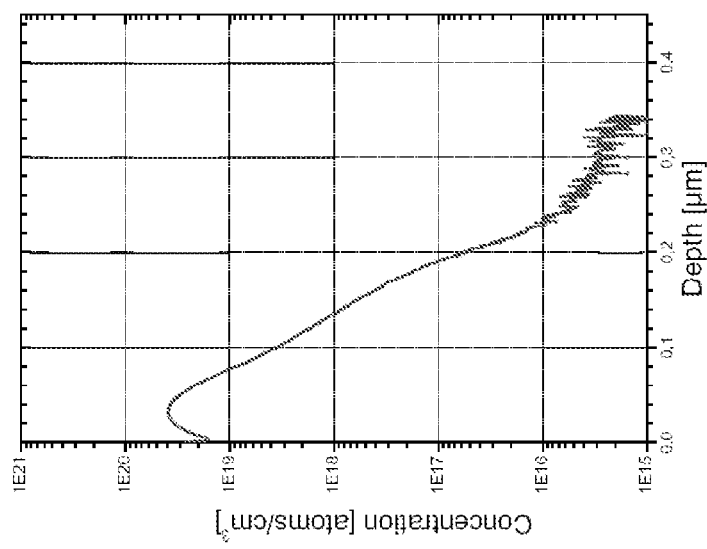

FIG. 15A illustrates an impurity profile (SIMS) of a shallow implantation using implantation energy $E_{impl1}$ without subjecting to any anneal. FIG. 15B illustrates the concentration profile (SIMS) after a laser anneal. Different thereto, FIG. 15C illustrates the concentration profile (SIMS) after a laser anneal for an implantation using implantation energy $E_{impl2}$ which is about 3 times as large as $E_{impl1}$. In both cases the same laser energy and pulse duration were used. When comparing FIGS. 15B and 15C the same melting depth can be identified by the location where the steep drop begins, which is at about 0.25 µm. FIG. 15C illustrates that a pronounced plateau-like concentration profile for the deep implantation is obtained while not such a pronounced plateau-shaping is recognisable for the shallow implantation. If the shallow implantation would be, for example, n-doped while the deep implantation p-doped a common laser anneal for the shallow and the deep implantation would result in the formation of a pn-junction since the doping concentration of the deep implantation exceed the doping concentration of the shallow implantation for depths larger than about 0.15 µm in this specific example. The formation of a pn-junction using a common laser anneal for a shallow and a deep implantation has been verified experimentally.

Figure 16:
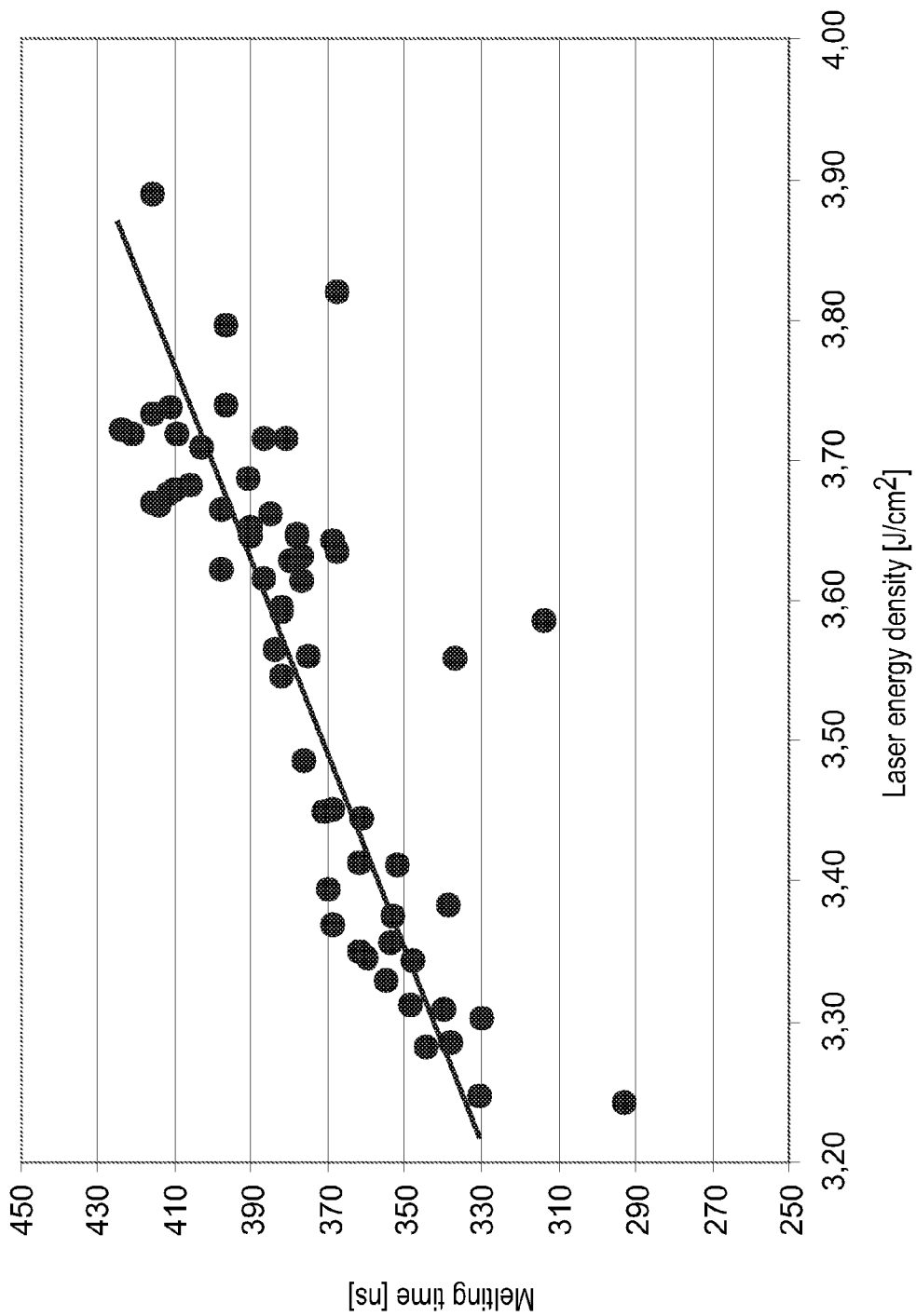
FIG. 16 illustrates the melting duration of a semiconductor substrate for laser pulses of constant duration but different energy densities.

The influence of the irradiated laser energy density on the melting time is illustrated in FIG. 16 showing measurements of the melting time for different laser energy densities at constant pulse duration which was about 150 ns. Again, a XeCl excimer laser was used. Each point corresponds to a separate measurement. As it becomes apparent, the melting duration increases with the increased laser energy density. This measurement also suggests that the temperature at the irradiated surface may exceed the melting temperature since the melting time significantly exceeds the pulse duration of 150 ns. Therefore, sufficient energy must be "stored" within the melted substrate portion to keep the semiconductor melted longer than the pulse duration. It is therefore assumed that the irradiated surface and therefore the portion of the semiconductor substrate which melts during the pulse duration are overheated with respect to the melting temperature. This assumption may also explain why high energy laser anneals result in the formation of pronounced plateaus. Hence, even at constant pulse duration the melting duration can be adjusted by appropriately selecting the laser energy.

Figure 17:
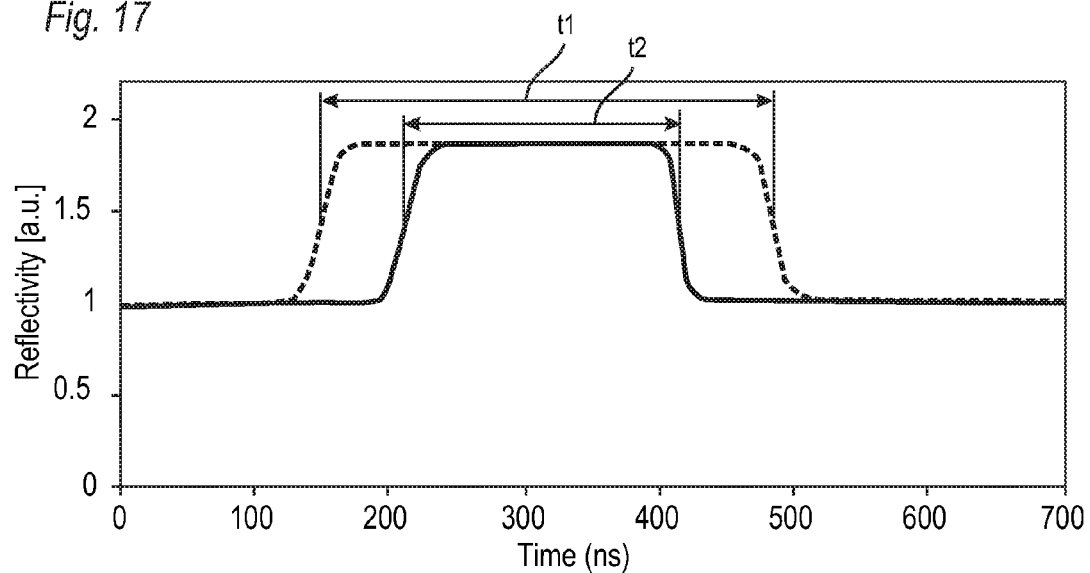
FIG. 17 illustrates the melting duration for different laser pulse width.

The determination of the melting time is illustrated in FIG. 17. A laser beam of a week probing laser, for example a HeNe laser, was used to measure the reflectivity of the irradiated surface. Since melted Si has a significantly increased reflectivity in comparison to solidified Si, change of the reflectivity can be used as a measure. The melting time is defined to be the duration when the reflectivity exceeds 50% of the maximum reflectivity. More specifically, if the reflectivity of the non-melted substrate is R1 and of the melted substrate R2, the melting duration is defined to be the time when the measured reflectivity R exceeds $R1+\frac{1}{2}*(R2-R1)$. FIG. 17 illustrates two examples of the determined melting time for different laser energy densities.

Figure 18:
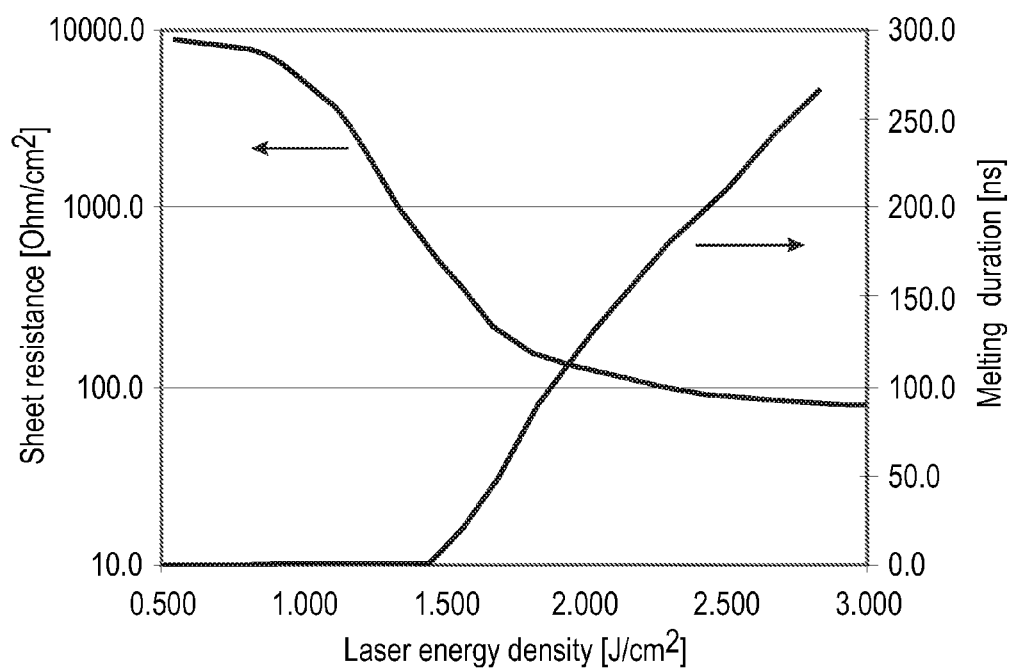
FIG. 18 illustrates the sheet resistance of a semiconductor substrate and the melting duration as a function of the laser energy density.

As verified by sheet resistance measurements, the activation of the implanted impurities also increases with higher laser energy densities as illustrated in FIG. 18. The smaller the sheet resistance, the more implanted impurities are activated.

Figure 6:
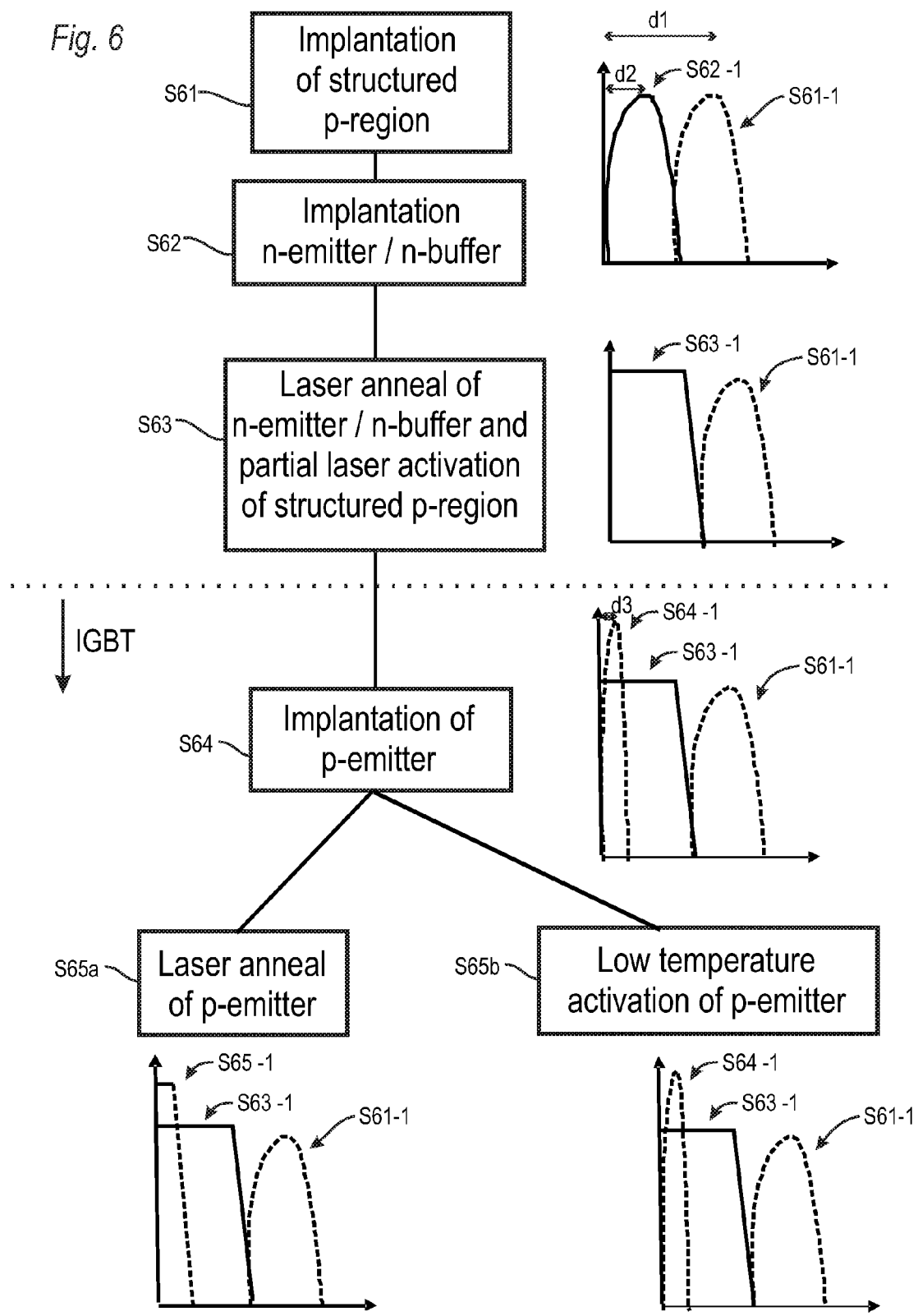
FIG. 6 illustrates processes of a method for manufacturing a diode and an IGBT according to one embodiment.
Figure 19:
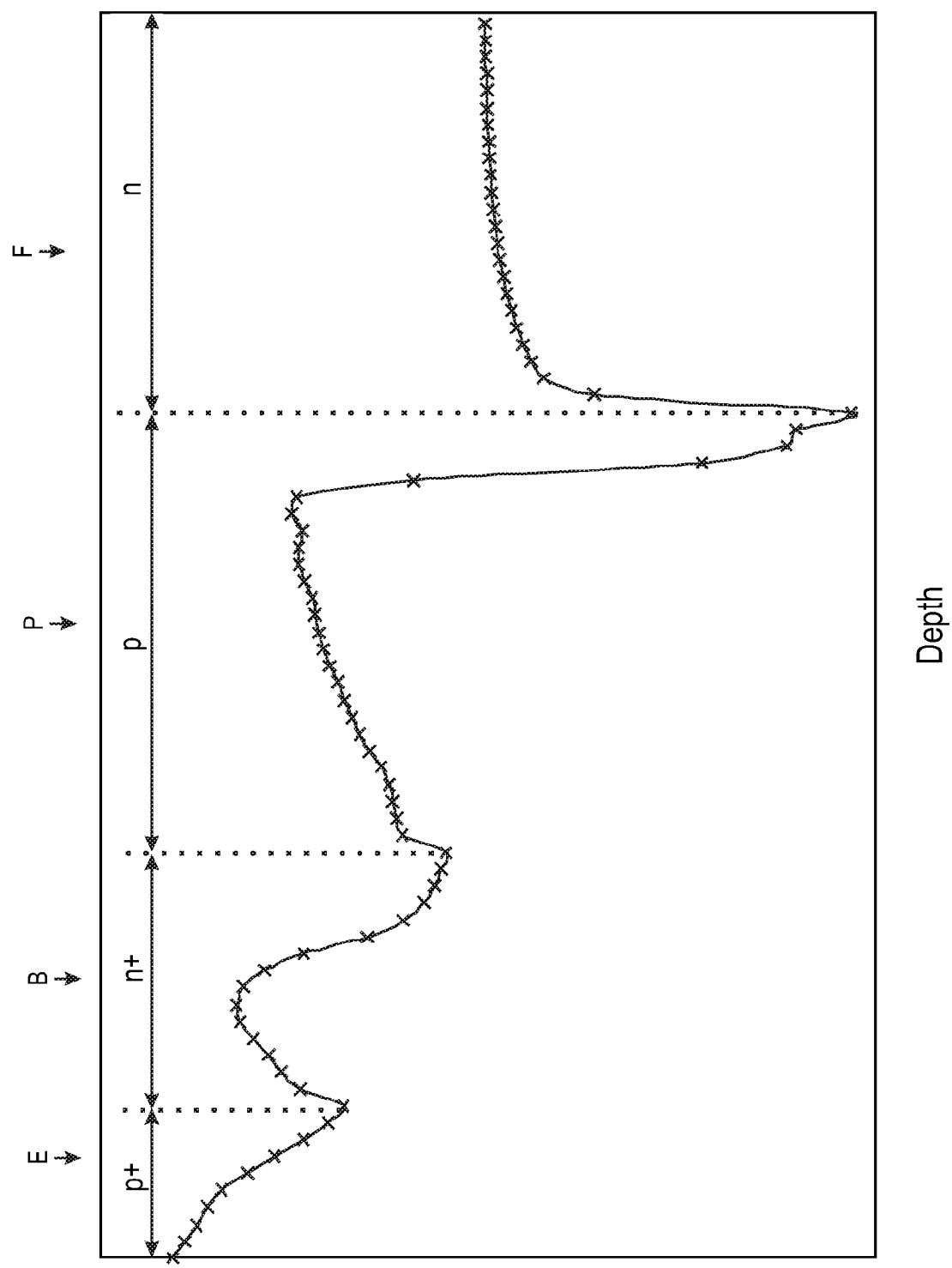
FIG. 19 illustrates the doping profile of an IGBT obtained by implanting and laser annealing of two doping regions.

FIG. 19 illustrates the doping profile of an IGBT manufactured according to the embodiment illustrated in FIG. 6 using the sequence S61-S62-S63-S-64-S65a. The doping profile obtained by SRP illustrates the resulting absolute net doping |p-n|. Therefore, the local minima correspond to the location of the formed pn-junctions. By using this representation showing the absolute net doping |p-n| the plateau-like doping regions can not be reproduced. Highly doped p-emitter E and n-buffer B were annealed using separate laser annealing processes with different energy densities as described in the embodiment illustrated in FIG. 6. Structured p-doped region P was furnace annealed at low temperature.

Figure 20A:
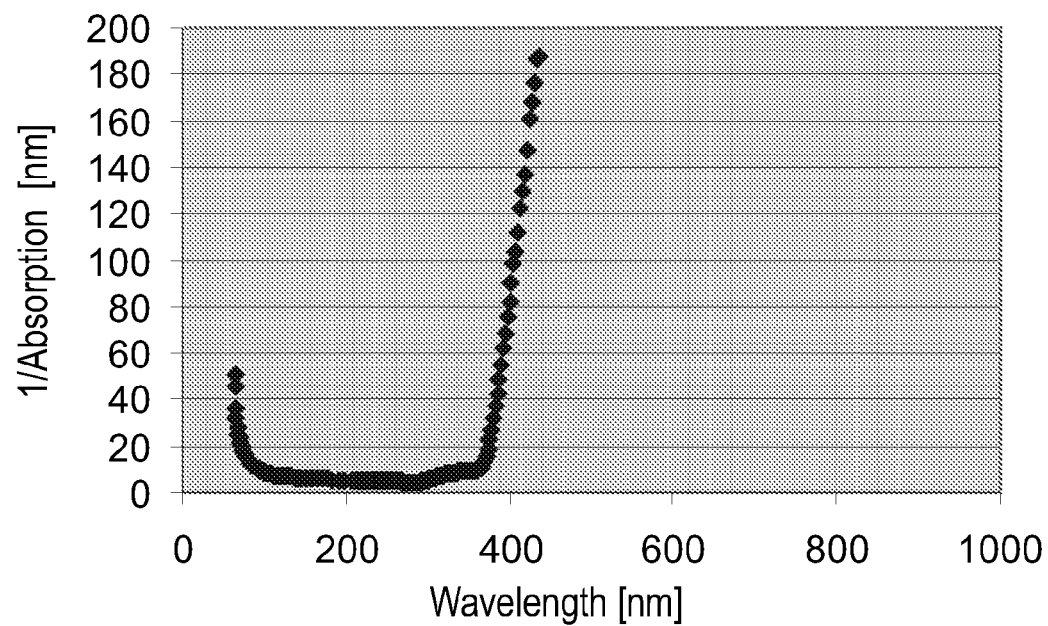
FIGS. 20A and 20B illustrate the absorption of silicon as a function of the wavelength.
Figure 20B:
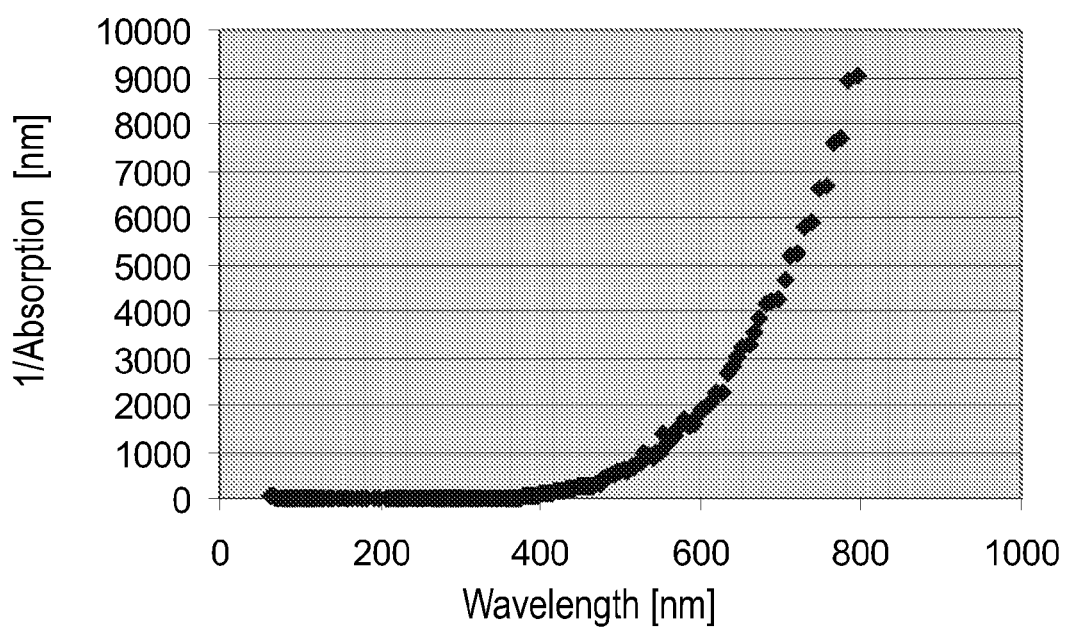

FIGS. 20A and 20B illustrate the dependence of the absorption on the wavelength of the used radiation. Since short wavelength are significantly stronger absorbed than larger wavelength, for example larger than 500 nm, radiation sources with short wavelength are typically used to ensure that the irradiated energy is adsorbed within the uppermost regions of the semiconductor substrate to avoid heating of deep substrate regions.

The above illustrated examples employ Si as semiconductor material. This should be, however, not considered as a limitation for the embodiments described herein.

The embodiments as described herein allow the fabrication of p-emitter, n-buffer and structured p-region with high efficiency, at low depth (about few tens to about few hundreds nanometers) and virtually without any implantation defects. Furthermore, front (first) and back (second) surface can be processed independently from each other since the annealing and activation of the doping regions at the back surface do not influence the doping regions and functional layers at the front surface. The embodiments can also be combined with the HDR-principle which employs injection damping means to reduce a charge carrier injection in peripheral regions of the device. Furthermore, a back side emitter being virtually free of any defects and capable of preventing a degradation of the reverse characteristic curve under strong dynamic load of the device can be fabricated.

As described herein, the embodiments allow a reduction of the number of processes carried out after thinning a semiconductor substrate at its back surface. Furthermore, variation of the employed laser energy can be used to manufacture a step-like arrangement of doping regions at the back surface.

Moreover, doping regions deeply arranged within the semiconductor substrate can either be activated without deeply melting simply by using the temperature rise associated with the laser anneal or by additional low temperature furnace anneals. Also, a pn-junction can be formed using a single or common laser anneal after implantation of two different dopants of opposite conductivity type.

The embodiments described herein can be used for the manufacturing of power device with blocking voltages from about 300V to about 13000V and above. The improvement of the softness can be used for many different devices such as diodes, IGBTs and thyristors. For example, when using a laser beam having a wavelength of about 307 nm, pulse duration of about 150 ns and a radiation energy density of about 4 J/cm$^2$ an annealed and activated semiconductor region down to a depth of about 300 nm to about 500 nm can be reliably formed. By varying the radiation energy density, for example, activated and annealed semiconductor regions having a thickness (vertical extension) between about 50 nm and about 1 µm can be fabricated close to the radiated surface as well as in the depth of the semiconductor substrate. Another option is to vary the radiation duration by increasing the pulse duration and/or the number of laser pulses.

Laser annealing causing an at least partial melting of the semiconductor substrate results in the formation of a characteristic plateau-like distribution of the dopant which can be used, for example, for the manufacturing of a cathode emitter and/or a buried structured region such as the structured p-doped region. The laser annealing can be verified by SIMS or SRP measurements.

In other words, a high voltage power semiconductor device including at least two doping regions in close proximity to its back side, wherein at least one zone is annealed using a melting laser anneal, is provided. Furthermore, a high voltage power semiconductor device including at least two doping regions in close proximity to its back side, wherein at least one of the doping regions is annealed using a melting laser anneal, is provided.

The written description above uses specific embodiments to disclose the invention, including the best mode, and also to enable any person skilled in the art to make and use the invention. While the invention has been described in terms of various specific embodiments, those skilled in the art will recognise that the invention can be practiced with modifications within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a semiconductor device, comprising:
    providing a semiconductor substrate comprising a first surface and a second surface, the second surface arranged opposite to the first surface;
    forming a first doping region by introducing a first dopant into the semiconductor substrate at the second surface such that its peak doping concentration in the semiconductor substrate is located at a first depth with respect to the second surface;
    performing at least a first laser anneal by directing at least one laser beam pulse onto the second surface to melt the semiconductor substrate, at least in sections, at the second surface to activate the first dopant;
    forming a second doping region by introducing a second dopant into the semiconductor surface at the second surface such that its peak doping concentration in the semiconductor substrate is located at a second depth with respect to the second surface, wherein the first depth is larger than the second depth; and
    performing at least a second laser anneal by directing at least a further laser beam pulse onto the second surface to melt the semiconductor substrate, at least in sections, at the second surface to activate the second dopant, wherein the second laser anneal is performed after introducing the second dopant.

2. The method of claim 1, wherein the laser beam pulse of the first laser anneal comprises a first energy density, and the laser beam pulse of the second laser anneal comprises a second energy density, wherein the first energy density is larger than the second energy density.

3. The method of claim 1, comprising performing the first laser anneal such that the semiconductor substrate at the second surface is melted substantially down to the first depth.

4. The method of claim 1, comprising performing the first laser anneal such that the semiconductor substrate at the second surface is melted substantially down to the second depth only.

5. The method of claim 1, further comprising:
    introducing a third dopant into the semiconductor substrate at the second surface such that its peak doping concentration in the semiconductor substrate is located at a third depth with respect to the second surface, wherein the third depth is smaller than the second depth.

6. The method of claim 5, further comprising:
    after introducing the third dopant, performing at least a further laser anneal by directing at least one laser beam pulse onto the second surface to melt the semiconductor substrate, at least in sections, at the second surface, wherein the further laser anneal is performed such that the semiconductor substrate at the second surface is melted substantially down to the third depth only.

7. The method of claim 5, further comprising:
    after introducing the third dopant, performing at least a further laser anneal by directing at least one laser beam pulse onto the second surface to melt the semiconductor substrate, at least in sections, at the second surface, wherein the further laser anneal is performed such that the semiconductor substrate at the second surface is melted substantially down to the second depth only.

8. The method of claim 5, comprising introducing the third dopant after performing the first laser anneal.

9. The method of claim 5, comprising introducing the first dopant after introducing the third dopant.

10. The method of claim 1, further comprising
    forming a further doping region by introducing a further dopant into the semiconductor substrate at the second surface such that its peak doping concentration in the semiconductor substrate is located at a depth with respect to the second surface which is larger than the first and the second depth, wherein the further dopant is introduced before the first and second dopants are introduced.

11. The method of claim 10, wherein introducing the further dopant comprises introducing the further dopant into the semiconductor substrate using a mask to form a structured doping region which is, when projecting onto the second surface, one of a connected region comprising portions of second conductivity type, which are completely surrounded by the structured doping region, and a simply connected region which is at last partially spaced to lateral edges of the semiconductor substrate.

12. The method of claim 1, further comprising forming a metallization layer on the first surface before the laser annealing processes.

13. The method of claim 1, comprising wherein the first dopant is of a first conductivity type and the second dopant is of a second conductivity type opposite to the first conductivity type.

14. The method of claim 13, comprising:
introducing the first dopant comprises introducing the first dopant into the semiconductor substrate using a mask to form a structured first doping region of the first conductivity type, wherein the first doping region, when projecting onto the second surface, is one of a connected region comprising portions of second conductivity type, which are completely surrounded by the first doping region, and a simply connected region which is at last partially spaced to lateral edges of the semiconductor substrate;
the introduced second dopant forms a second doping region of the second conductivity type; and
the first and second doping regions form a pn-junction.

15. A method for manufacturing a semiconductor device, comprising:
providing a semiconductor substrate comprising a first surface and a second surface, the second surface being arranged opposite to the first surface;
introducing a first dopant into the semiconductor substrate at the second surface such that its peak doping concentration in the semiconductor substrate is located at a first depth with respect to the second surface;
performing at least a first laser anneal by directing at least one laser beam pulse comprising a first energy density onto the second surface to melt the semiconductor substrate, at least in sections, at the second surface;
introducing a second dopant into the semiconductor surface at the second surface such that its peak doping concentration in the semiconductor substrate is located at a second depth with respect to the second surface, wherein the first depth is larger than the second depth; and
performing at least a second laser anneal by directing at least one further laser beam pulse comprising a second energy density onto the second surface to melt the semiconductor substrate, at least in sections, at the second surface, wherein the second energy density is smaller than the first energy density.

16. The method of claim 15, further comprising:
introducing a third dopant into the semiconductor substrate at the second surface such that its peak doping concentration in the semiconductor substrate is located at a third depth with respect to the second surface, wherein the third depth is smaller than the second depth.

17. A method for manufacturing a semiconductor device, comprising:
providing a semiconductor substrate comprising a first surface and a second surface, the second surface being arranged opposite to the first surface;
introducing a first dopant into the semiconductor substrate at the second surface such that its peak doping concentration in the semiconductor substrate is located at a first depth with respect to the second surface;
introducing a second dopant into the semiconductor surface at the second surface such that its peak doping concentration in the semiconductor substrate is located at a second depth with respect to the second surface, wherein the second depth is smaller than the first depth;
performing at least a first laser anneal by directing at least one laser beam pulse onto the second surface to melt the semiconductor substrate, at least in sections, at the second surface.

18. The method of claim 17, comprising performing the laser anneal after introducing the first dopant and before introducing the second dopant.

19. The method of claim 17, comprising:
introducing the second dopant before the first dopant; and
performing the laser anneal after introducing the second dopant and before introducing the first dopant.

20. The method of claim 17, comprising performing the laser anneal after introducing the first and second dopants.

21. A method for manufacturing a semiconductor device, comprising:
providing a semiconductor substrate comprising a first surface and a second surface, opposite to the first surface;
forming a first doping region by introducing a first dopant into the semiconductor substrate at the second surface having a peak doping concentration at a first depth with respect to the second surface;
performing at least a first laser anneal at the second surface to activate the first dopant;
forming a second doping region by introducing a second dopant into the semiconductor surface at the second surface having a peak doping concentration at a second depth with respect to the second surface, wherein the first depth is larger than the second depth; and
performing at least a second laser anneal at the second surface to activate the second dopant.

* * * * *

UNITED STATES PATENT AND TRADEMARK OFFICE
CERTIFICATE OF CORRECTION

PATENT NO.        : 7,842,590 B2                                     Page 1 of 1
APPLICATION NO.   : 12/110740
DATED             : November 30, 2010
INVENTOR(S)       : Gutt et al.

It is certified that error appears in the above-identified patent and that said Letters Patent is hereby corrected as shown below:

Title Page, FOREIGN PATENT DOCUMENTS, delete "102004013931 A1" and insert in place thereof --102004013932 A1--.

Signed and Sealed this
Fifteenth Day of March, 2011

David J. Kappos
*Director of the United States Patent and Trademark Office*